US009349879B2

United States Patent
Kim et al.

(10) Patent No.: US 9,349,879 B2
(45) Date of Patent: *May 24, 2016

(54) NON-VOLATILE MEMORY DEVICES INCLUDING BLOCKING INSULATION PATTERNS WITH SUB-LAYERS HAVING DIFFERENT ENERGY BAND GAPS

(71) Applicant: Samsung Electronics Co., Ltd., Suwon-si (KR)

(72) Inventors: Ju-Hyung Kim, Yongin-si (KR); Chang-Seok Kang, Seongnam-si (KR); Sung-Il Chang, Hwaseong-si (KR); Jung-Dal Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/554,859

(22) Filed: Nov. 26, 2014

(65) Prior Publication Data

US 2015/0084114 A1    Mar. 26, 2015

Related U.S. Application Data

(60) Continuation of application No. 14/163,228, filed on Jan. 24, 2014, now abandoned, which is a continuation of application No. 13/305,930, filed on Nov. 29, 2011, now Pat. No. 8,643,077, which is a division of application No. 12/266,032, filed on Nov. 6, 2008, now Pat. No. 8,089,114.

(30) Foreign Application Priority Data

Nov. 8, 2007   (KR) .................. 10-2007-0113796
Mar. 14, 2008  (KR) .................. 10-2008-0023972

(51) Int. Cl.
*H01L 29/788* (2006.01)
*H01L 29/792* (2006.01)
(Continued)

(52) U.S. Cl.
CPC ........ *H01L 29/792* (2013.01); *H01L 21/28273* (2013.01); *H01L 21/28282* (2013.01);
(Continued)

(58) Field of Classification Search
CPC ............ H01L 29/792; H01L 29/66825; H01L 21/28282; H01L 29/66833; H01L 29/42324; H01L 27/11517; H01L 29/788; H01L 29/518; H01L 27/11563
USPC .......................................... 257/315, 321, 324
See application file for complete search history.

(56) References Cited

U.S. PATENT DOCUMENTS

| | | | |
|---|---|---|---|
| 6,693,321 B1 | 2/2004 | Zheng et al. | |
| 6,858,906 B2 | 2/2005 | Lee et al. | |
| 7,001,814 B1 | 2/2006 | Halliyal et al. | |
| 7,018,868 B1 | 3/2006 | Yang et al. | |
| 7,463,530 B2 | 12/2008 | Lue et al. | |

(Continued)

FOREIGN PATENT DOCUMENTS

| | | |
|---|---|---|
| KR | 20030012268 A | 2/2003 |
| KR | 1020030065702 | 8/2003 |

(Continued)

OTHER PUBLICATIONS

Strehlow et al. "Compilation of Energy Band Gaps in Elemental and Binary Compound Semiconductors and Insulators" *J. Phys. Chem. Data*, vol. 2(1), pp. 163-199, 1973.

*Primary Examiner* — Minh-Loan Tran
(74) *Attorney, Agent, or Firm* — Myers Bigel & Sibley, P.A.

(57) ABSTRACT

A non-volatile memory device may include a semiconductor substrate and an isolation layer on the semiconductor substrate wherein the isolation layer defines an active region of the semiconductor substrate. A tunnel insulation layer may be provided on the active region of the semiconductor substrate, and a charge storage pattern may be provided on the tunnel insulation layer. An interface layer pattern may be provided on the charge storage pattern, and a blocking insulation pattern may be provided on the interface layer pattern. Moreover, the block insulation pattern may include a high-k dielectric material, and the interface layer pattern and the blocking insulation pattern may include different materials. A control gate electrode may be provided on the blocking insulating layer so that the blocking insulation pattern is between the interface layer pattern and the control gate electrode. Related methods are also discussed.

18 Claims, 30 Drawing Sheets

(51) Int. Cl.
  *H01L 27/115* (2006.01)
  *H01L 29/66* (2006.01)
  *H01L 29/423* (2006.01)
  *H01L 21/28* (2006.01)
  *H01L 29/51* (2006.01)

(52) U.S. Cl.
  CPC ........ *H01L27/115* (2013.01); *H01L 27/11517* (2013.01); *H01L 27/11529* (2013.01); *H01L 27/11563* (2013.01); *H01L 27/11568* (2013.01); *H01L 29/4234* (2013.01); *H01L 29/42324* (2013.01); *H01L 29/42348* (2013.01); *H01L 29/51* (2013.01); *H01L 29/513* (2013.01); *H01L 29/517* (2013.01); *H01L 29/518* (2013.01); *H01L 29/66825* (2013.01); *H01L 29/66833* (2013.01); *H01L 29/788* (2013.01); *H01L 29/7883* (2013.01)

(56) References Cited

U.S. PATENT DOCUMENTS

| | | |
|---|---|---|
| 7,485,526 B2 | 2/2009 | Mouli et al. |
| 8,643,077 B2 * | 2/2014 | Kim et al. ............ 257/315 |
| 2003/0030100 A1 | 2/2003 | Lee et al. |
| 2004/0033664 A1 | 2/2004 | Park |
| 2005/0151184 A1 | 7/2005 | Lee et al. |
| 2006/0180851 A1 | 8/2006 | Lee et al. |
| 2006/0202263 A1 | 9/2006 | Lee |
| 2007/0132004 A1 | 6/2007 | Yasuda et al. |
| 2010/0019305 A1 | 1/2010 | Sakagami et al. |

FOREIGN PATENT DOCUMENTS

| | | |
|---|---|---|
| KR | 100481856 B1 | 2/2004 |
| KR | 1020050083280 | 8/2005 |
| KR | 1020060024189 | 3/2006 |
| KR | 100648860 | 11/2006 |

* cited by examiner

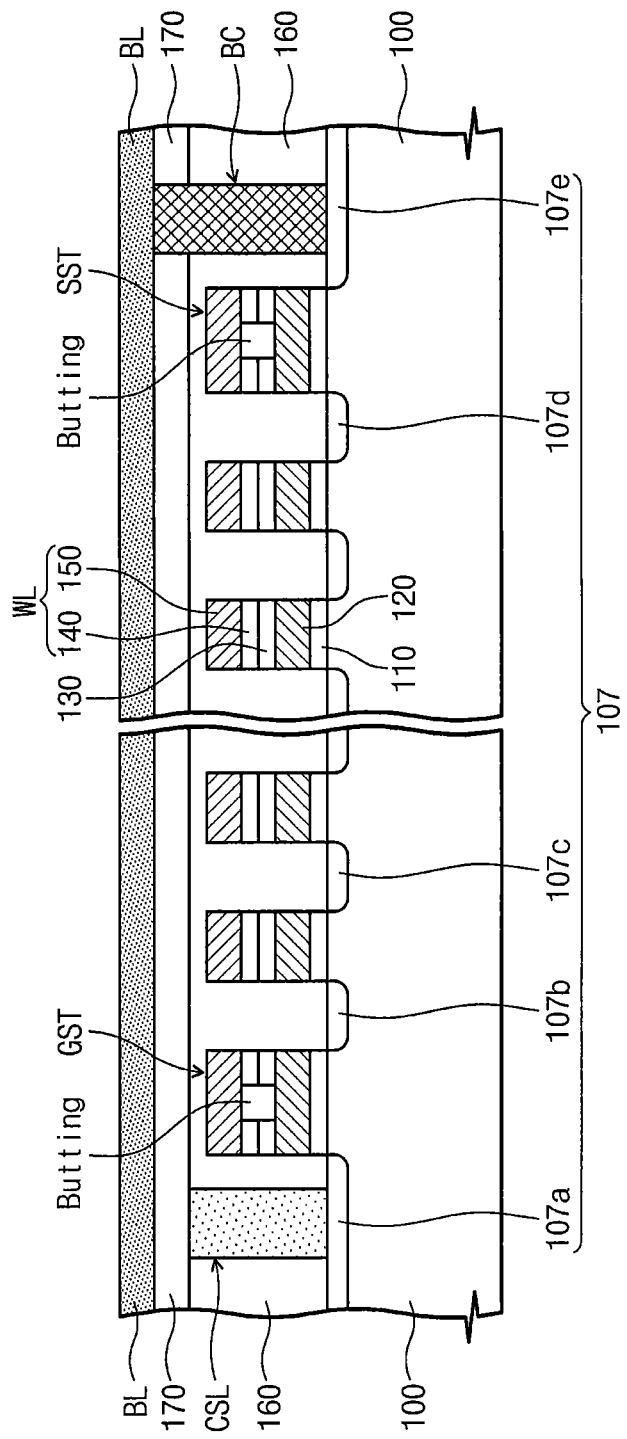

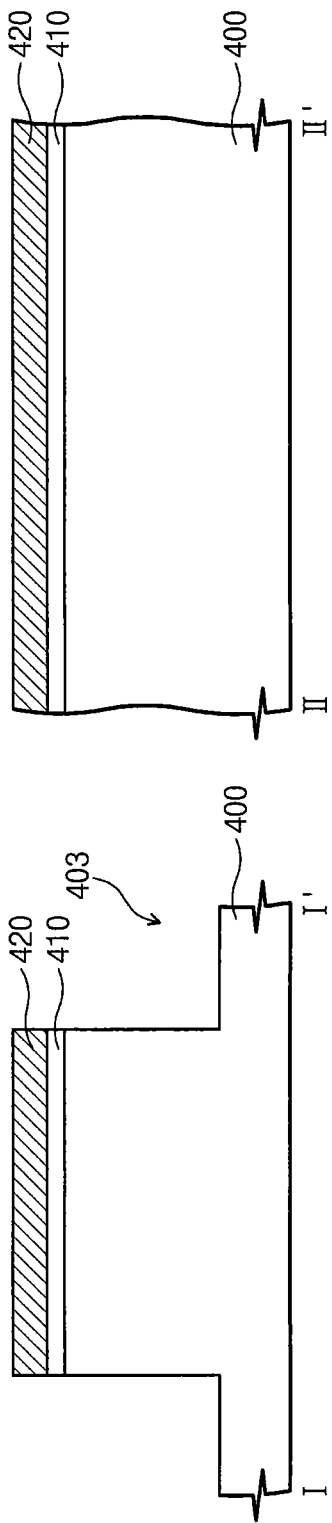

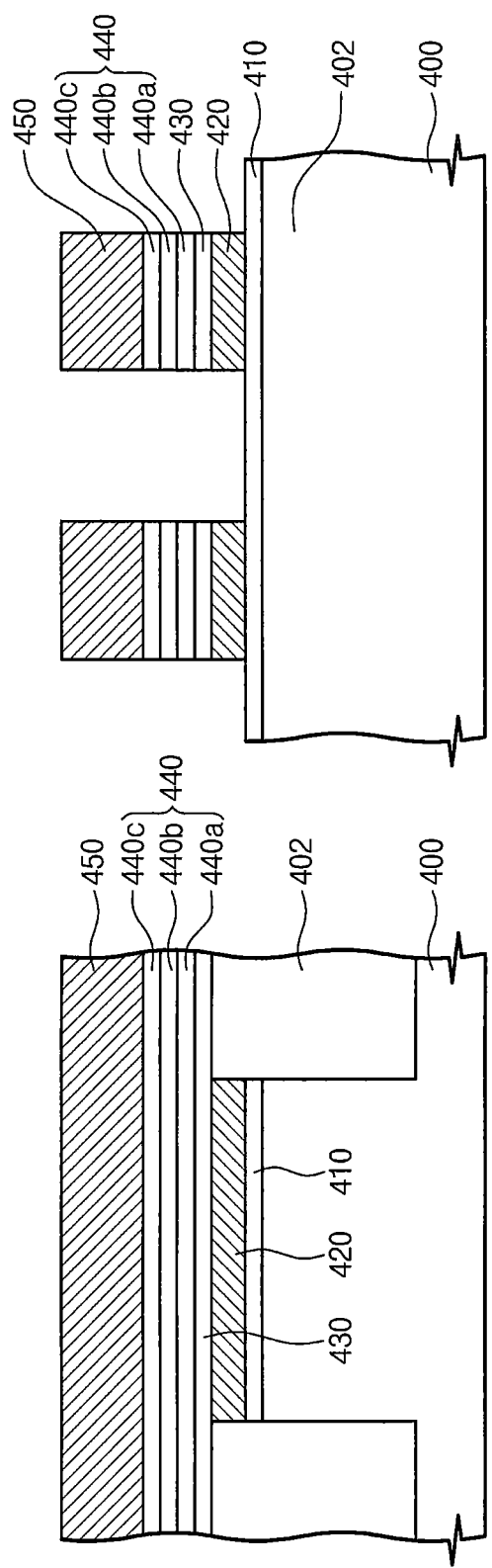

NON-VOLATILE MEMORY DEVICES INCLUDING BLOCKING INSULATION PATTERNS WITH SUB-LAYERS HAVING DIFFERENT ENERGY BAND GAPS

RELATED APPLICATIONS

This U.S. non-provisional patent application Claims the benefit of priority as a continuation of U.S. application Ser. No. 14/163,228 filed Jan. 24, 2014, which claims the benefit of priority as a continuation of U.S. application Ser. No. 13/305,930 filed Nov. 29, 2011, which claims the benefit of priority as a divisional of U.S. application Ser. No. 12/266,032 filed Nov. 6, 2008, which claims the benefit of priority under 35 U.S.C. §119 of Korean Patent Application No. 10-2007-0113796, filed on Nov. 8, 2007, and Korean Patent Application No. 10-2008-0023972, filed on Mar. 14, 2008. The disclosures of all of the above referenced U.S. and Korean applications are hereby incorporated herein by reference in their entities.

BACKGROUND

The present invention disclosed herein relates to memory devices, and more particularly, to non-volatile memory devices.

A non-volatile memory device retains its stored information even when there is no power supply. A flash memory device as a representative non-volatile memory device stores information based on whether electric charges are stored or not in a floating gate interposed between a control gate and a substrate.

FIG. 1 is a cross sectional view of a conventional non-volatile memory device.

Referring to FIG. 1, a device isolation layer 12 is formed in a semiconductor substrate 10 to define an active region and a tunnel insulation layer 14 is formed on the active region in a non-volatile memory device such as a flash memory device. A floating gate 16 is formed on the tunnel insulation layer 14, and a blocking insulation pattern 18 is formed on the floating gate 16 and the device isolation layer 12. A control gate electrode 20 is formed on the blocking insulation pattern 18. In a typical non-volatile memory device, the floating gate 16 is formed protruding higher than the device isolation layer 12 in order to augment a coupling ratio by increasing a surface area of the floating gate 16 that contacts the blocking insulation pattern 18. A typical structure of this non-volatile memory device may have various limitations if an interval between the floating gates 16 is decreased due to the high degree of integration. If the height of the floating gate 16 is increased and the interval between the floating gates 16 is decreased, a conductive layer for forming the control gate electrode 20 may not be completely filled between the floating gates 16. Additionally, as illustrated in FIG. 1, a parasitic capacitance C1 may be formed between the floating gates 16, and as the interval between the floating gates 16 is reduced, the parasitic capacitance may increase. Therefore, an interference phenomenon between adjacent memory cells may be significant. Additionally, if a high-k dielectric layer is used as the blocking insulation pattern 18 between the charge storage pattern 16 and the control gate electrode 20 to increase the coupling ratio, a leakage current $I_{leakage}$ may increase between the charge storage pattern 16 and the control gate electrode 20.

In a case of an erase operation of a non-volatile flash memory including a doped silicon/oxide/nitride/oxide/silicon (SONOS) structure and a floating gate, because a back tunneling current flows, a speed of the erase operation may deteriorate.

SUMMARY

According to some embodiments of the present invention, a non-volatile memory device may include a semiconductor substrate and an isolation layer on the semiconductor substrate, and the isolation layer may define an active region of the semiconductor substrate. A tunnel insulation layer may be on the active region of the semiconductor substrate, and a charge storage pattern may be on the tunnel insulation layer so that the tunnel insulation layer is between the charge storage pattern and the active region of the semiconductor substrate. An interface layer pattern may be on the charge storage pattern so that the charge storage pattern is between the tunnel insulation layer and the interface layer pattern. A blocking insulation pattern may be on the interface layer pattern so that the interface layer pattern is between the charge storage pattern and the blocking insulation pattern. Moreover, the block insulation pattern may include a high-k dielectric material, and the interface layer pattern and the blocking insulation pattern comprise different materials. A control gate electrode may be on the blocking insulating layer so that the blocking insulation pattern is between the interface layer pattern and the control gate electrode.

According to some other embodiments of the present invention, a non-volatile memory device may include a semiconductor substrate and a tunnel insulation layer on the semiconductor substrate. A charge storage pattern may be on the tunnel insulation layer so that the tunnel insulation layer is between the charge storage pattern and the semiconductor substrate. A blocking insulation pattern may be on the charge storage pattern so that the charge storage pattern is between the tunnel insulation layer and the blocking insulation pattern. Moreover, the blocking insulation pattern may include a first blocking insulation sub-layer, a second blocking insulation sub-layer, and a third blocking insulation sub-layer. The second blocking insulation sub-layer may be between the first and third blocking insulation sub-layers, and an energy band gap of the second blocking insulation may be greater than energy band gaps of the first and third blocking insulation sub-layers.

Embodiments of the present invention may provide a non-volatile memory device of a structure with a reduced leakage current between a charge storage pattern and a gate electrode.

Embodiments of the present invention may also provide methods of fabricating non-volatile memory devices having structures with reduced leakage current between charge storage patterns and control gate electrodes.

Embodiments of the present invention may also provide a non-volatile memory with a reduced back tunneling current.

Embodiments of the present invention may also provide a non-volatile memory device with an increased retention time.

Embodiments of the present invention may provide non-volatile memory devices including a device isolation layer, a charge storage pattern, an interface layer pattern, a blocking insulation pattern, and a control gate electrode. The device isolation layer may define a plurality of active regions in a semiconductor substrate. The charge storage pattern may be formed by interposing a tunnel insulation layer on the active regions. The interface layer pattern may be formed on the charge storage pattern. The blocking insulation pattern may include a high-k dielectric on the interface layer pattern. The control gate electrode may be formed on the blocking insulation pattern, and the interface layer pattern may include a material different from that of the blocking insulation pattern.

In some embodiments, the interface layer pattern may reduce a leakage current between the charge storage pattern and the control gate electrode.

In other embodiments, the interface layer pattern may be conductor or a semiconductor, and the interface layer patterns on the active regions may be separated from each other.

In still other embodiments, the interface layer pattern may include at least one of metal, a metal compound, metal silicide, silicon, and a metal nitride layer.

In even other embodiments, the interface layer pattern may be a dielectric and may extend on the device isolation layer.

In yet other embodiments, the interface layer pattern may include at least of one of a silicon oxide layer, a silicon nitride layer, and a silicon oxide nitride layer.

In further embodiments, a top of the device isolation layer may be higher than that of the active region. The tunnel insulation layer and the charge storage pattern may be sequentially-stacked on the active region. The tunnel insulation layer and bottom sides of the charge storage pattern may be aligned to each other. A top of the charge storage pattern may be higher than that of the device isolation layer, the charge storage patterns may be separated from each other, and the interface layer pattern may be disposed on a top and a top side of the charge storage pattern.

In still further embodiments, a top of the device isolation layer may be higher than that of the active region. The tunnel insulation layer and the charge storage pattern may be sequentially-stacked on the active region. The interface layer pattern may be disposed on the charge storage pattern. Sides of the tunnel insulation layer, the charge storage pattern, and interface layer pattern may be aligned to each other, and a height of a top of the interface layer pattern may be the same as that of the device isolation layer.

In even further embodiments, a top of the device isolation layer may be higher than that of the active region. The tunnel insulation layer and the charge storage pattern may be sequentially-stacked on the active region. The interface layer pattern may be disposed on the charge storage pattern. Sides of the tunnel insulation layer and the charge storage pattern may be aligned to each other. The interface layer pattern may extend on the device isolation layer, and a height of a top of the charge storage pattern may be the same as that of the device isolation layer.

In yet further embodiments, a top of the device isolation layer may be higher than that of the active region. The tunnel insulation layer and the charge storage pattern may be sequentially-stacked on the active region. The tunnel insulation layer and bottom sides of the charge storage pattern may be aligned to each other. A top of the charge storage pattern may be higher than that of the device isolation layer, and the interface layer pattern may be disposed on a top and a top side of the charge storage pattern.

In yet further embodiments, a top of the device isolation layer may be higher than that of the active region. The tunnel insulation layer and the charge storage pattern may be sequentially-stacked on the active region. The tunnel insulation layer and bottom sides of the charge storage pattern may be aligned to each other. A top of the charge storage pattern may be higher than that of the device isolation layer, and the interface layer pattern may be disposed on a top and a top side of the charge storage pattern and on the device isolation layer.

In yet further embodiments, a top of the device isolation layer may be higher than that of the active region. The tunnel insulation layer and the charge storage pattern may be sequentially-stacked on the active region. The tunnel insulation layer and bottom sides of the charge storage pattern may be aligned to each other. A top of the charge storage pattern may be higher than that of the device isolation layer. The interface layer pattern may be disposed on a top of the charge storage pattern, and top sides of the interface layer pattern and the charge storage pattern may be aligned to each other.

In yet further embodiments, the blocking insulation pattern may include a sequentially-stacked first blocking insulation pattern, a second blocking insulation pattern, and a third blocking insulation pattern. A permittivity of the second blocking insulation pattern may be less than permittivities of the first blocking insulation pattern and the third blocking insulation pattern.

In yet further embodiments, the charge storage pattern may include at least one of doped silicon, metal, and a metal compound.

In yet further embodiments, the control gate electrode may include at least one of sequentially-stacked barrier metal/high work function metal, sequentially-stacked metal/barrier metal/metal, sequentially-stacked doped polysilicon/barrier metal/high work function metal, metal, and doped polysilicon.

In yet further embodiments, the barrier metal may include a metal nitride layer.

In other embodiments of the present invention, non-volatile memory device may include a tunnel insulation pattern, a charge storage pattern, a blocking insulation pattern, and a control gate electrode. The tunnel insulation pattern may be formed on a semiconductor substrate. The charge storage pattern may be formed on the tunnel insulation pattern. The blocking insulation pattern may be formed on the charge storage pattern. The control gate electrode may be formed on the blocking insulation pattern. The blocking insulation pattern may include a sequentially-stacked first blocking insulation pattern, second blocking insulation pattern, and third blocking insulation pattern. An energy band gap of the second blocking insulation pattern may be greater than those of the first blocking insulation pattern and the third blocking insulation pattern.

In some embodiments, the charge storage pattern may be an insulating material with a charge trap site or a conductive floating gate.

In other embodiments, a permittivity of the second blocking insulation pattern may be less than permittivities of the first blocking insulation pattern and the third blocking insulation pattern.

In still other embodiments, a trap density of the second blocking insulation pattern may be less than trap densities of the first blocking insulation pattern and the third blocking insulation pattern.

In even other embodiments, the blocking insulation pattern may further include a fourth blocking insulation pattern on the third blocking insulation pattern to alternate a material of a different energy band gap.

In yet other embodiments, the first blocking insulation pattern and the third blocking insulation pattern may include at least one of a metal oxide layer, a metal nitride layer, and a metal oxide nitride layer.

In further embodiments, the second blocking insulation pattern may include at least one of a silicon oxide layer, a metal oxide layer, a metal nitride layer, and a metal oxide nitride layer.

In still further embodiments, the charge storage pattern may include at least one of a silicon nitride layer, a metal quantum dot, a silicon quantum dot, metal, doped silicon, and doped germanium.

In even further embodiments, the floating gate may include at least one of n-type conductive polysilicon, p-type conductive polysilicon, metal, and doped germanium.

In yet further embodiments, the metal may include at least one of a pure metal and a metal compound.

In yet further embodiments, the control gate electrode may have a structure of a sequentially-stacked barrier metal and high work function metal.

In yet further embodiments, the high work function metal may have a work function of more than 4.5 eV.

In yet further embodiments, the barrier metal may include at least one of a metal nitride layer, a silicon nitride layer, and a combination thereof, each of which may reduce reaction between the high work function metal and the blocking insulation layer.

In yet further embodiments, the control gate electrode may include at least one of a high work function metal and doped polysilicon, each of which is interposed between the barrier metal and the blocking insulation layer.

In yet further embodiments, the control gate electrode may include a sequentially-stacked doped silicon and metal, a pure metal, and a metal containing material.

In yet further embodiments, the first blocking insulation pattern may include the same material as the third blocking insulation pattern and the first blocking insulation pattern may have the same energy band gap as the third blocking insulation pattern.

BRIEF DESCRIPTION OF THE FIGURES

The accompanying figures are included to provide a further understanding of the present invention, and are incorporated in and constitute a part of this specification. The drawings illustrate examples of embodiments of the present invention and, together with the description, serve to explain principles of the present invention. In the figures:

FIGS. 3A through 3C are respective plan and cross sectional views illustrating a NAND non-volatile memory device according to embodiments of the present invention;

FIGS. 14A through 14D are cross-sectional views illustrating operations of fabricating a non-volatile memory device according to some embodiments of the present invention;

DETAILED DESCRIPTION

Figure 1:
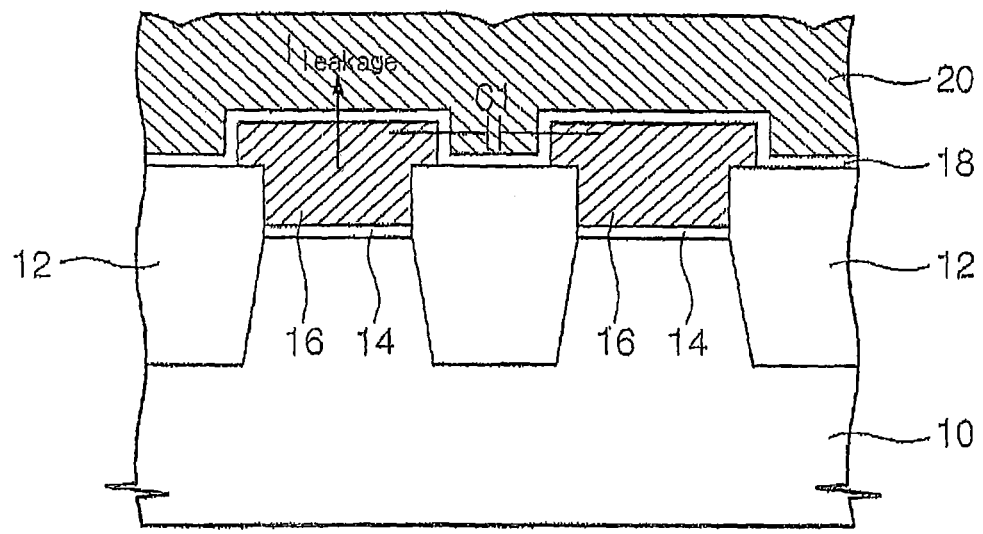
FIG. 1 is a cross sectional view of a conventional non-volatile memory device.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", "top", "higher", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 2:
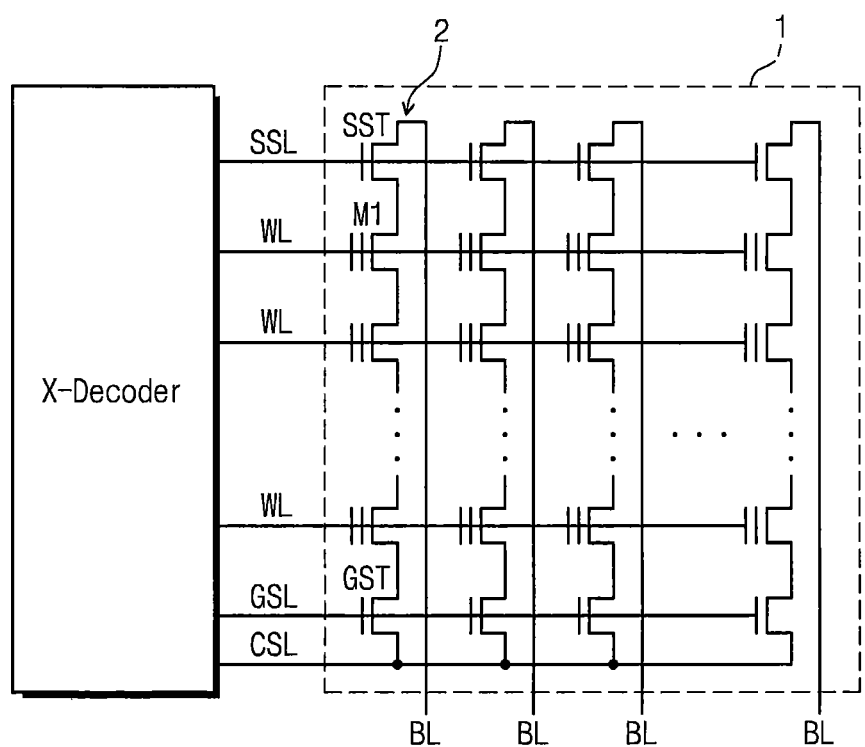
FIG. 2 is a block diagram illustrating a non-volatile memory device including a memory cell array according to embodiments of the present invention.

FIG. 2 is a block diagram illustrating a non-volatile memory device including a memory cell array according to some embodiments of the present invention. The memory cell array 1 includes a plurality of cell transistors M1. Each cell transistor M1 is provided on a conductive semiconductor substrate and includes conductive source and drain regions spaced a predetermined distance apart from each other, a charge storage pattern (not shown) storing charges and disposed on a channel region between the source and drain regions, an interface layer (not shown) disposed on the charge storage pattern, a blocking insulation pattern (not shown) formed on the interface layer pattern, and a control gate electrode (not shown) disposed on the blocking insulation pattern.

Referring to FIG. 2, the memory cell array 1 includes a plurality of cell strings 2 corresponding to respective bit lines BL. Each cell string 2 includes a string selection transistor SST as a first selection transistor, a ground selection transistor GST as a second selection transistor, and a plurality of memory cells M1 connected in series between the string and ground selection transistors SST and GST. The string selection transistor SST includes a drain connected to the corresponding bit line BL and a gate connected to a string selection line SSL. The ground selection transistor GST includes a source connected to a common source line CSL and a gate connected to a ground selection line GSL. The memory cells M1 are connected in series between the source of the string selection transistor SST and the drain of the ground selection transistor GST. The memory cells M1 are connected to the corresponding word lines WL, respectively. The word lines WL, the string selection line SSL, and the ground selection line GSL are connected to an X-decoder.

Figure 3A:
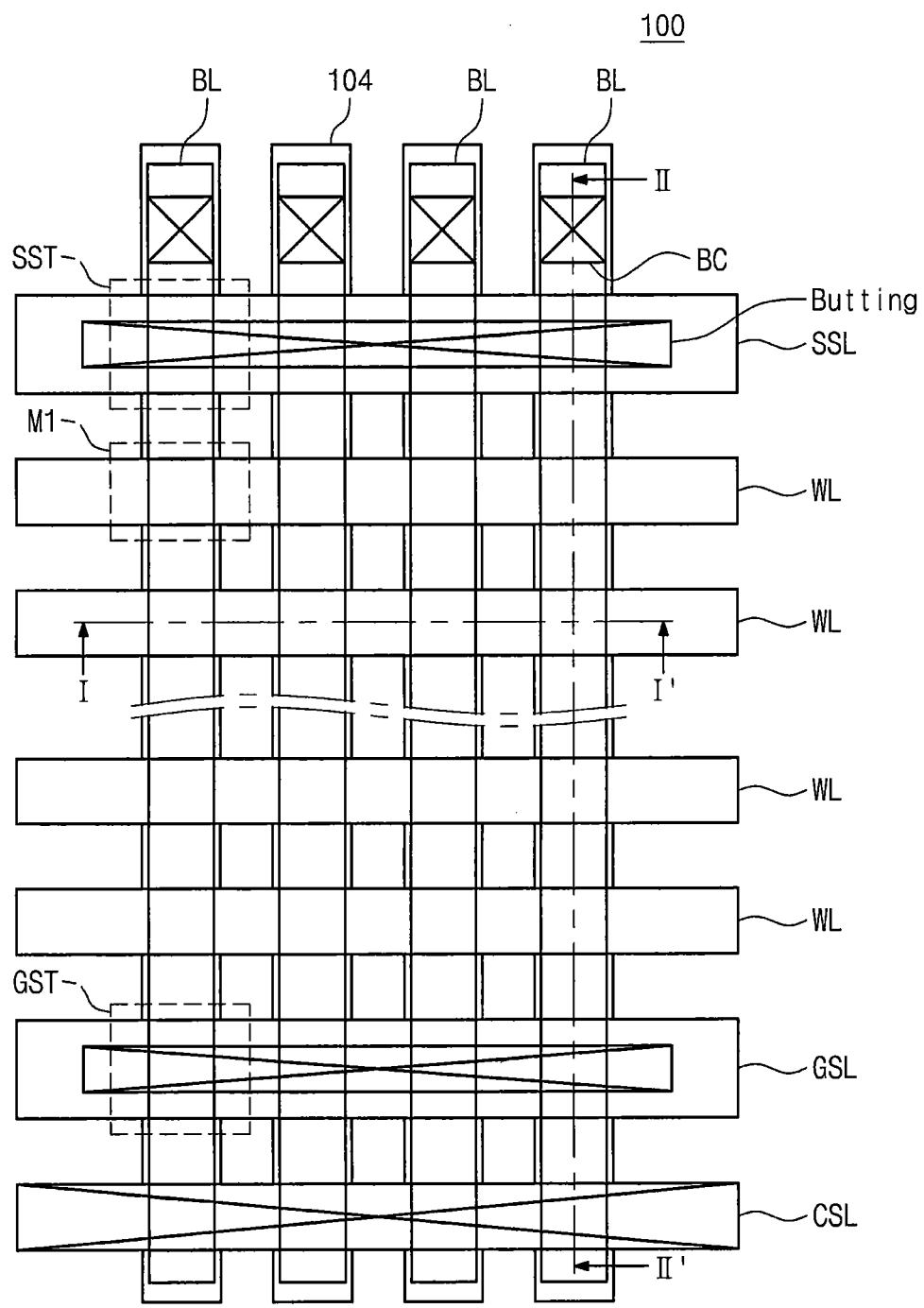
Figure 3B:
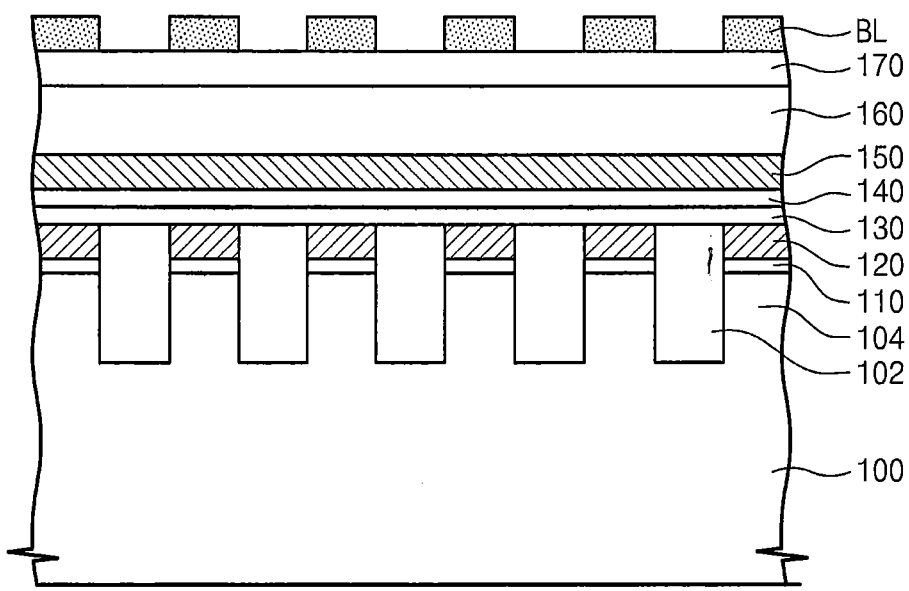

FIGS. 3A through 3C are views illustrating a NAND non-volatile memory device according to embodiments of the present invention. FIG. 3B is a cross-sectional view taken along line I-I'. FIG. 3C is a cross-sectional view taken along line II-II' of FIG. 3A.

Referring to FIGS. 3A and 3B, the NAND non-volatile memory device includes a semiconductor substrate 100 having a cell region. A device isolation layer 102 is disposed in the semiconductor substrate 100. The device isolation layer 102 defines active regions 104. The active regions 104 extend in one direction. A string selection line SSL and a ground selection line GSL laterally cross over the active regions 104 and a plurality of word lines WL laterally cross over the active regions 104 between the string selection line SSL and the ground selection line GSL. The string selection line SSL, the ground selection line GSL, and the word lines WL extend in another direction crossing over the one direction. The string selection line SSL, the word lines WL, and the ground selection lines GSL may be included in a cell string group. The cell string group may be repeatedly disposed along the one direction in mirror symmetry.

Impurity regions 107 corresponding to a source and a drain may be disposed in the active regions 104 on the both sides of each of the string selection line SSL, the word lines WL, and the ground selection line GSL. The word line WL and the impurity regions 107c on the both sides of the word line WL provide a cell transistor. The ground selection line GSL and impurity regions 107a and 107b on both sides of the ground selection line GSL provide a ground selection transistor GST. The string selection line SSL and impurity regions 107d and 107e on both sides of the string selection line SSL provide a string selection transistor SST.

The word line WL may include a tunnel insulation layer 110, a charge storage pattern 120, an interface layer pattern 130, a blocking insulation pattern 140, and a control gate electrode 150. The tunnel insulation layer 110 may include at least one of a silicon oxide layer and a high-k dielectric layer (i.e., a layer of a dielectric material having a relatively high dielectric constant). A high-k dielectric layer, for example, may be a layer of a dielectric material having a dielectric constant greater than that of silicon oxide. The charge storage pattern 120 may be a conductor or a dielectric based on a floating gate non-volatile memory or a charge trap non-volatile memory. The charge storage pattern 120 may include doped polysilicon for a floating gate non-volatile memory. The charge storage pattern 120 may include a silicon nitride layer for charge trap non-volatile memory.

A hard mask pattern (not shown) may be disposed on the control gate electrode 150. The ground selection line GSL and the string selection ling SSL may have the same structure as a word line WL, or widths of the string selection ling SSL and the ground selection line GSL may be different from that of a word line WL. More particularly, a portion or the entirety of the interface layer pattern 130 and the blocking insulation pattern 140 may be removed from the string selection line SSL and the ground selection line GSL such that a butting contact is formed to electrically connect the charge storage pattern 120 with the control gate electrode 150.

According to a modified embodiment of the present invention, layers of the ground and string selection lines GSL and SSL corresponding to the tunnel insulation layer 110, the charge storage pattern 120, the interface layer pattern 130, and the blocking insulation pattern 140 may be used as a gate dielectric and insulation layers of the ground and string selection transistors.

The common source line CSL is disposed on the sources 107a of the ground selection transistors GST, and the common source line CSL may extend a direction perpendicular with respect to the bit lines. A respective bit line contact BC is disposed on the drain 107e of each string selection transistor SST. The bit line contact BC is connected to the bit line BL that extends in a direction perpendicular with respect to the word lines.

Figure 4:
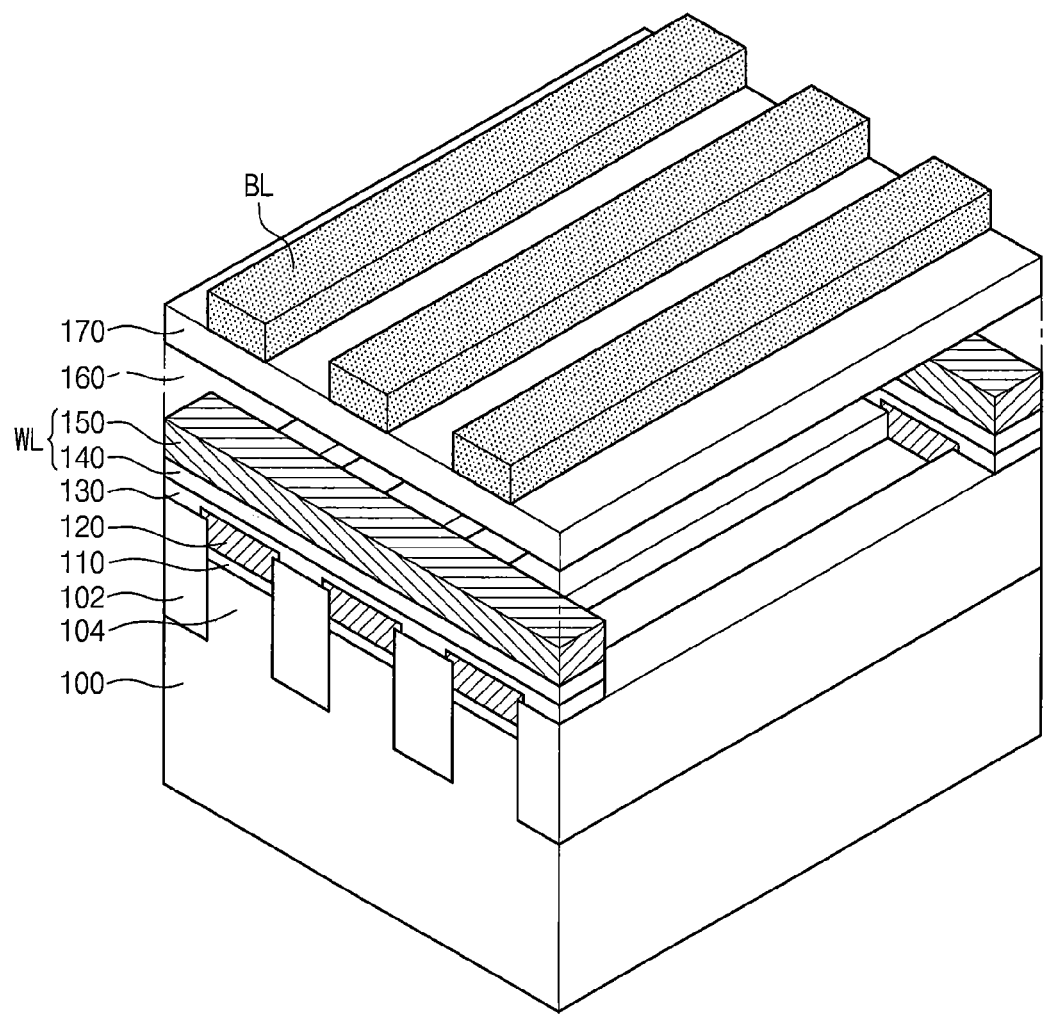
FIGS. 4 through 8 are perspective views illustrating a non-volatile memory device according to some embodiments of the present invention.

FIG. 4 is a perspective view illustrating a non-volatile memory device according to some embodiments of the present invention.

Referring to FIG. 4, a device isolation layer 102 is formed in a semiconductor substrate 100 to define an active region 104. The device isolation layer 102 may be formed by applying a shallow trench isolation (STI) technique. The top of the device isolation layer 102 may be higher than that of the active region 104. A tunnel insulation layer 110 may be formed on the active region 104. The tunnel insulation layer 110 may be formed using a thermal oxide process. Charge storage patterns 120 may be formed on the tunnel insulation layer 110 and the device isolation layer 102. Each charge storage pattern 120 may be separated from adjacent charge storage patterns 120 so that the charge storage patterns 120 formed on the active regions 104 may be separated from each other. The charge storage pattern 120 may cover a portion of the device isolation layer 102. Accordingly, the top of the charge storage pattern 120 may be higher than that of the device isolation layer 102. The charge storage pattern 120 may be formed by forming and patterning a charge storage layer (not shown) on the tunnel insulation layer 110. Accordingly, charge storage patterns 120 on an adjacent active region 104 may be separated from each other. An interface layer pattern 130, a blocking insulation pattern 140, and a control gate electrode 150 may be sequentially disposed on the charge storage pattern 120 and the device isolation layer 102. The interface layer pattern 130 may be conformally formed on the charge storage pattern 120 and the device isolation layer 102. The top of the interface layer pattern 130 may have a curved shape. The interface layer pattern 130 may extend toward the charge storage pattern 120 on other adjacent active regions 104. The sides of the charge storage pattern 120, the interface layer pattern 130, the blocking insulation pattern 140, and the control gate electrode 150 may be aligned. The interface layer pattern 130 may reduce transfer of charges stored in charge storage patterns 120. When the blocking insulation pattern 140 includes a high-k dielectric layer, the interface layer pattern 130 may reduce a leakage current between the control gate electrode 150 and the charge storage pattern 120. The interface layer pattern 130 may be formed of a material that improves an interface junction characteristic between the blocking insulation pattern 140 and the charge storage pattern 120. A first interlayer insulation layer 160 and a second interlayer insulation layer 170 may be formed on the control gate electrode 150. Bit lines BL may be formed on the second interlayer insulation layer 170.

The device isolation layer 102 may be formed using an STI technique. The device isolation layer may be a silicon oxide layer.

The tunnel insulation layer 110 may include a thermal oxide layer having the thickness in the range of about 20 Å (Angstroms) to 100 Å (Angstroms) and may be formed using in-situ steam generation (ISSG). That is, an oxide layer may be formed by injecting hydrogen and oxygen in a chamber at 850° C. (degrees C.) to 900° C. (degrees C.) at a pressure in the rage of about 5 Torr to 100 Torr. The tunnel insulation layer 110 is not limited to the silicon oxide layer and may include at least one of a silicon oxide nitride layer and/or a metal oxide layer.

The charge storage pattern 120 may be formed of polysilicon. The polysilicon may be polysilicon that is in-situ doped during a deposition process. The charge storage pattern 120 is not limited to polysilicon and may include at least one of doped silicon, a metal, and/or a metal compound.

The charge storage pattern 120 may be a charge trap layer. The charge trap layer may include a silicon nitride layer. The charge storage pattern 120 is not limited to a single layer structure and may have a multilayered structure. The charge storage pattern 120 may include at least one of a silicon quantum dot, a metal quantum dot, high concentration silicon, and high concentration germanium, each of which is included in an insulation layer.

The interface layer pattern 130 may include at least one of a dielectric, a conductor, and/or a semiconductor. If the interface layer pattern 130 is a dielectric, it may include at least one of a silicon oxide layer, a silicon nitride layer, and/or a silicon oxide nitride layer. If the charge storage pattern 120 is formed of polysilicon, and if the blocking insulation pattern 140 includes an aluminum oxide layer, the interface layer pattern 130 may be formed of a silicon oxide layer. If the interface layer pattern 130 is a dielectric, the interface patterns 130 disposed on adjacent active regions 104 may be connected to each other.

According to other embodiments of the present invention, if the interface layer pattern 130 is a conductor or a semiconductor, the interface layer patterns 130 disposed on adjacent active regions 104 may be separated from each other. If the interface layer pattern 130 is a conductor or a semiconductor, the interface layer pattern 130 may include at least one of a metal, a metal compound, metal silicide, silicon, and a metal nitride layer. For example, if the charge storage pattern 120 is a conductor or a semiconductor and the blocking insulation pattern 140 is an aluminum oxide layer, the interface layer pattern 130 may include a metal nitride layer.

The blocking insulation pattern 140 may include a high-k dielectric layer. The high-k dielectric layer may have a higher permittivity than a silicon oxide layer. The high-k dielectric layer can increase the above-mentioned coupling ratio. The blocking insulation pattern 140 may include a first blocking insulation pattern, a second blocking insulation pattern, and a third blocking insulation pattern, which are sequentially-stacked. A permittivity of the second blocking insulation pattern may be less than those of the first blocking insulation pattern and the third blocking insulation pattern. More particularly, an aluminum oxide layer may be used as the first and third blocking insulation patterns, and a silicon oxide layer may be used as the second blocking insulation pattern. The blocking insulation pattern may further include a fourth blocking insulation pattern on the third blocking insulation pattern. The fourth blocking insulation pattern may have the same material as the second blocking insulation pattern. The first blocking insulation pattern may include at least one of a metal oxide layer, a metal nitride layer, and/or a metal oxide nitride layer, each of which has a higher permittivity than a silicon oxide layer. The metal oxide layer may include at least one of an aluminum oxide layer, a hafnium oxide layer, a zirconium oxide layer, and/or a hafnium aluminum oxide layer. The second blocking insulation pattern may include at least one of a silicon oxide layer, a silicon oxide nitride layer, a silicon nitride layer, a metal oxide layer, a metal nitride layer, and/or a metal oxide nitride layer.

The control gate electrode 150 may include at least one of sequentially-stacked barrier metal/high work function metal, sequentially-stacked high work function metal/barrier metal/metal, sequentially-stacked doped polysilicon/barrier metal/metal, sequentially-stacked metal/doped polysilicon, metal, and/or doped polysilicon. The barrier metal may include at least one of a metal nitride layer and/or a metal oxide nitride layer.

Figure 5:
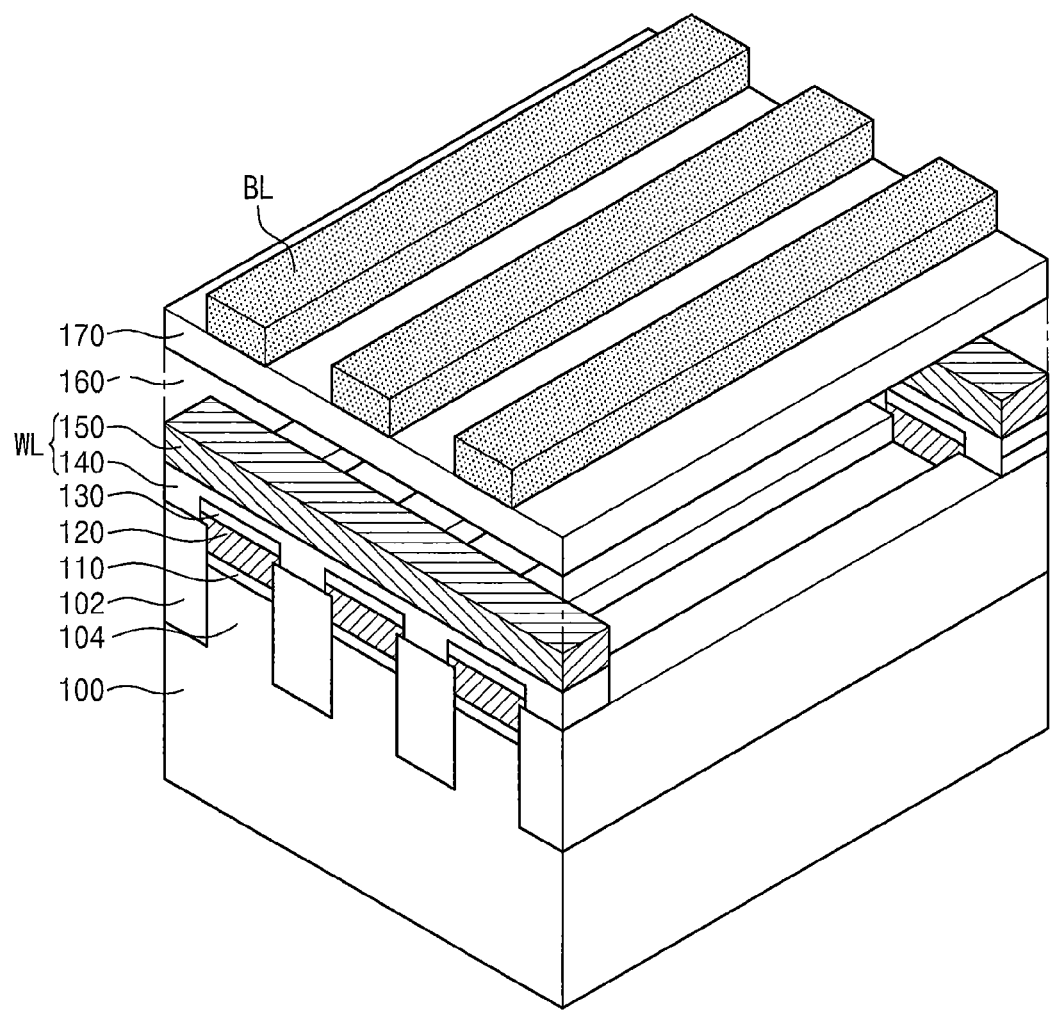

FIG. 5 is a perspective view illustrating a non-volatile memory device according to other embodiments of the present invention.

Referring to FIG. 5, a device isolation layer 102 is formed in a semiconductor substrate 100 to define an active region 104. The device isolation layer 102 may be formed using an a STI technique. The top of the device isolation layer 102 may be higher than that of the active regions 104. The tunnel insulation layer 110 may be formed on the active regions 104. The tunnel insulation layer 110 may be formed using a thermal oxide process. The charge storage pattern 120 may be formed on the tunnel insulation layer 110 and the device isolation layer 102. Each charge storage pattern 120 may be separated from adjacent charge storage patterns 120. That is, the charge storage patterns 120 formed on the active regions 104 may be separated from each other. Each charge storage pattern 120 may cover a portion of the device isolation layer 102. Accordingly, the top of a charge storage pattern 120 may be higher than that of the device isolation layer 102. Sidewalls of a charge storage pattern 120 and an interface layer pattern 130 thereon aligned with each other. An interface layer pattern 130 of a charge storage pattern 120 may be separated from another interface layer pattern 130 on an adjacent charge storage pattern 120. A blocking insulation pattern 140 is conformally formed on the charge storage pattern 120 and the device isolation layer 102. The blocking insulation pattern 140 may fill space between adjacent charge storage patterns 120. The top of the blocking insulation pattern 140 may be uneven.

A control gate electrode 150 is disposed on the blocking insulation pattern 140. The interface layer pattern 130 may reduce transfer of charges stored in the charge storage pattern 120. When the blocking insulation pattern 140 includes a high-k dielectric layer, the interface layer pattern 130 may reduce a leakage current between the control gate electrode 150 and the charge storage pattern 120. The interface layer pattern 130 may be formed of a material that improves an interface junction characteristic between the blocking insulation pattern 140 and the charge storage pattern 120. A first interlayer insulation layer 160 and a second interlayer insulation layer 170 may be formed on the control gate electrode(s) 150. A bit line(s) BL may be formed on the second interlayer insulation layer 170. Further description of elements previously discussed with respect to FIG. 4 will be omitted for conciseness.

Figure 6:
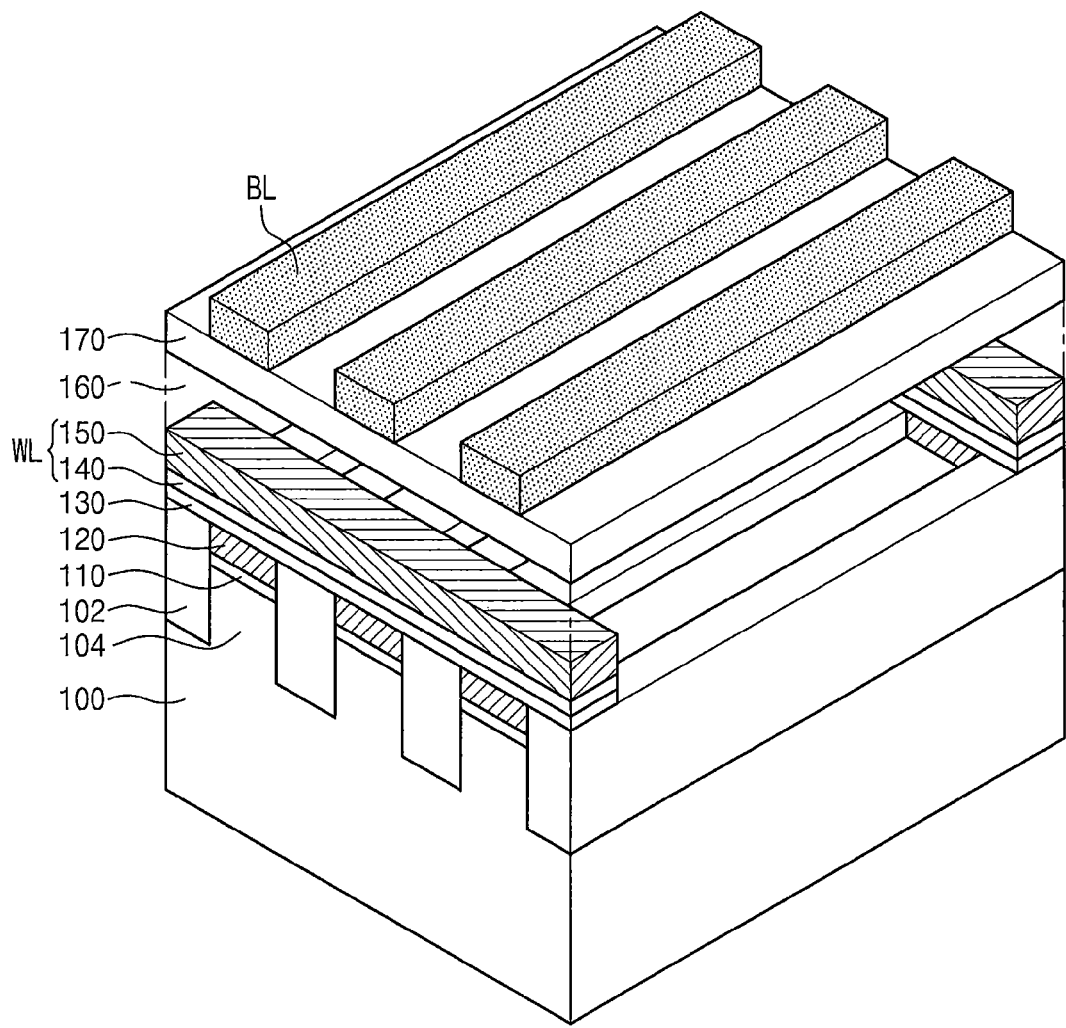

FIG. 6 is a perspective view illustrating a non-volatile memory device according to further embodiments of the present invention.

Referring to FIG. 6, a device isolation layer 102 is formed on a semiconductor substrate 100 to define active regions 104. The device isolation layer 102 may be formed using an STI technique. The top of the device isolation layer 102 may be higher than that of the active region 104. The tunnel insulation layer 110 may be formed on the active region 104. The tunnel insulation layer 110 may be formed using a thermal oxide process. A charge storage pattern 120 may be formed on the tunnel insulation layer 110 and the device isolation layer 102. Each charge storage pattern 120 may be separated from adjacent charge storage patterns 120. That is, the charge storage patterns 120 formed on the active regions 104 may be separated from each other. The top of each charge storage pattern 120 may have the same height as that of the device isolation layer 102. An interface layer pattern 130, a blocking insulation pattern 140, and a control gate electrode 150 may be sequentially disposed on the charge storage pattern 120 and the device isolation layer 102. Sidewalls of the charge storage pattern 120, the interface pattern 130, the blocking insulation pattern 140, and the control gate electrode 150 may be aligned with each other. The interface layer pattern 130 may be formed of a dielectric and may extend in a direction of the word line WL.

The interface layer pattern 130 may reduce transfer of charges stored in the charge storage pattern 120. When the blocking insulation pattern 140 includes a high-k dielectric layer, the interface layer pattern 130 may reduce a leakage current between the control gate electrode 150 and the charge storage pattern 120. The interface layer pattern 130 may be formed of a material that improves an interface junction characteristic between the blocking insulation pattern 140 and the charge storage pattern 120. A first interlayer insulation layer 160 and a second interlayer insulation layer 170 may be formed on the control gate electrode(s) 150. A bit line(s) BL may be formed on the second interlayer insulation layer 170. Further description of elements previously discussed with respect to FIG. 4 will be omitted for conciseness.

Figure 7:
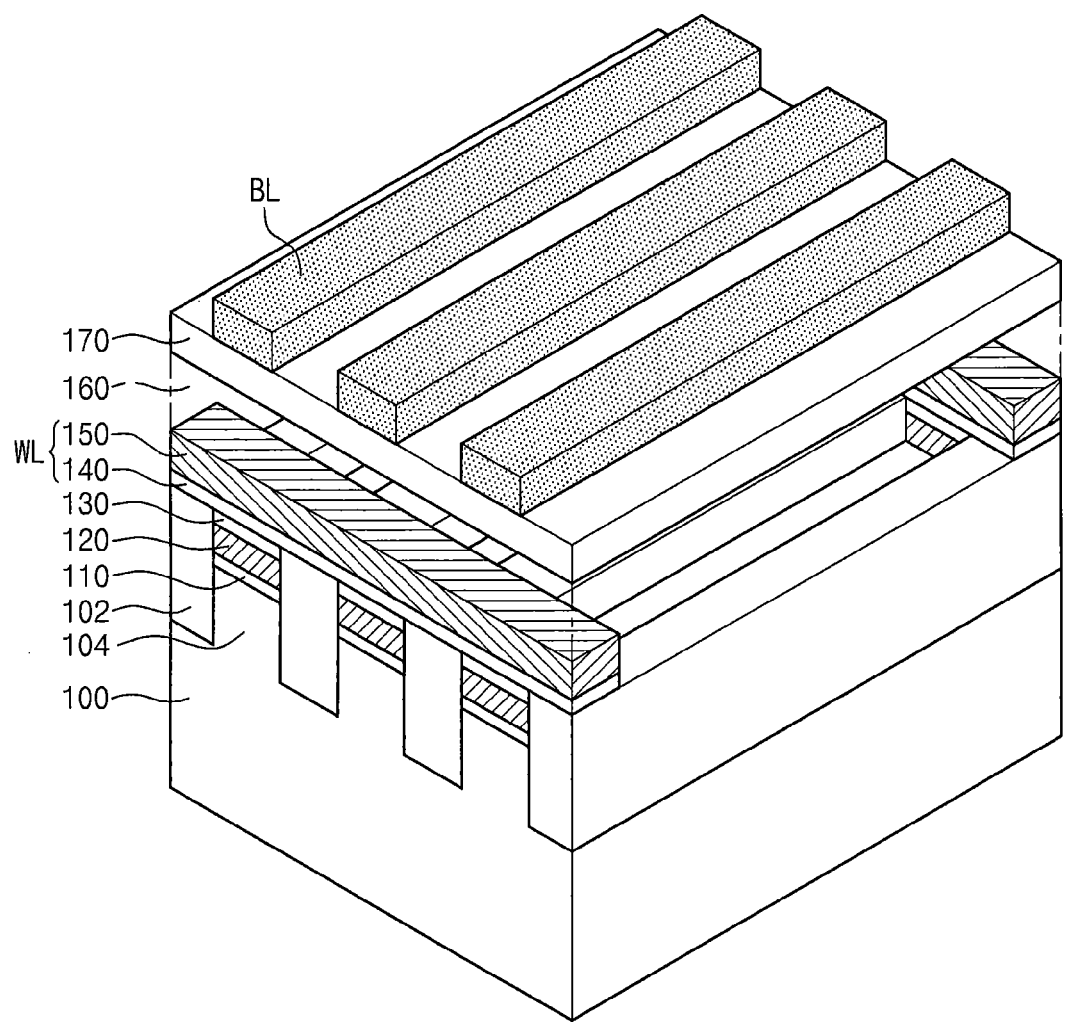

FIG. 7 is a perspective view illustrating a non-volatile memory device according to further embodiments of the present invention.

Referring to FIG. 7, a device isolation layer 102 is formed on a semiconductor substrate 100 to define active regions 104. The device isolation layer 102 may be formed using an STI technique. The top of the device isolation layer 102 may be higher than that of the active regions 104. A tunnel insulation layer 110 may be formed on the active regions 104. The tunnel insulation layer 110 may be formed using a thermal oxide process. A charge storage pattern 120 may be formed on the tunnel insulation layer 110 and the device isolation layer 102. Each charge storage pattern 120 may be separated from adjacent charge storage patterns 120. The charge storage patterns 120 formed on the active regions 104 may be separated from each other. The charge storage patterns 120 may be disposed between adjacent device isolation layers 102. Accordingly, the top of each charge storage pattern 120 may be lower than that of the device isolation layer 102. Accordingly, a parasitic capacitance can be reduced between adjacent charge storage patterns 120. An interface layer pattern 130 may be disposed on each charge storage pattern 120. The top of each interface layer pattern 130 may be substantially even with that of the device isolation layer 130. Additionally, each interface layer pattern 130 may be separated from other interface patterns 130 disposed on adjacent active regions 104. The interface layer pattern 130 may be formed of a conductor, a dielectric, and/or a semiconductor. The interface layer pattern 130 may include a metal silicide and/or a thermal oxide layer.

A blocking insulation pattern 140 and a control gate electrode 150 are sequentially disposed on the interface layer pattern 130 and the device isolation layer 102. The interface layer pattern 130 may reduce transfer of charges stored in the charge storage pattern 120. When the blocking insulation pattern 140 includes a high-k dielectric layer, the interface layer pattern 130 may reduce a leakage current between the control gate electrode 150 and the charge storage pattern 120. The interface layer pattern 130 may be formed of a material that improves an interface junction characteristic between the blocking insulation pattern 140 and the charge storage pattern 120. A first interlayer insulation layer 160 and a second interlayer insulation layer 170 may be formed on the control gate electrode(s) 150. A bit line(s) BL may be formed on the second interlayer insulation layer 170.

Figure 8:
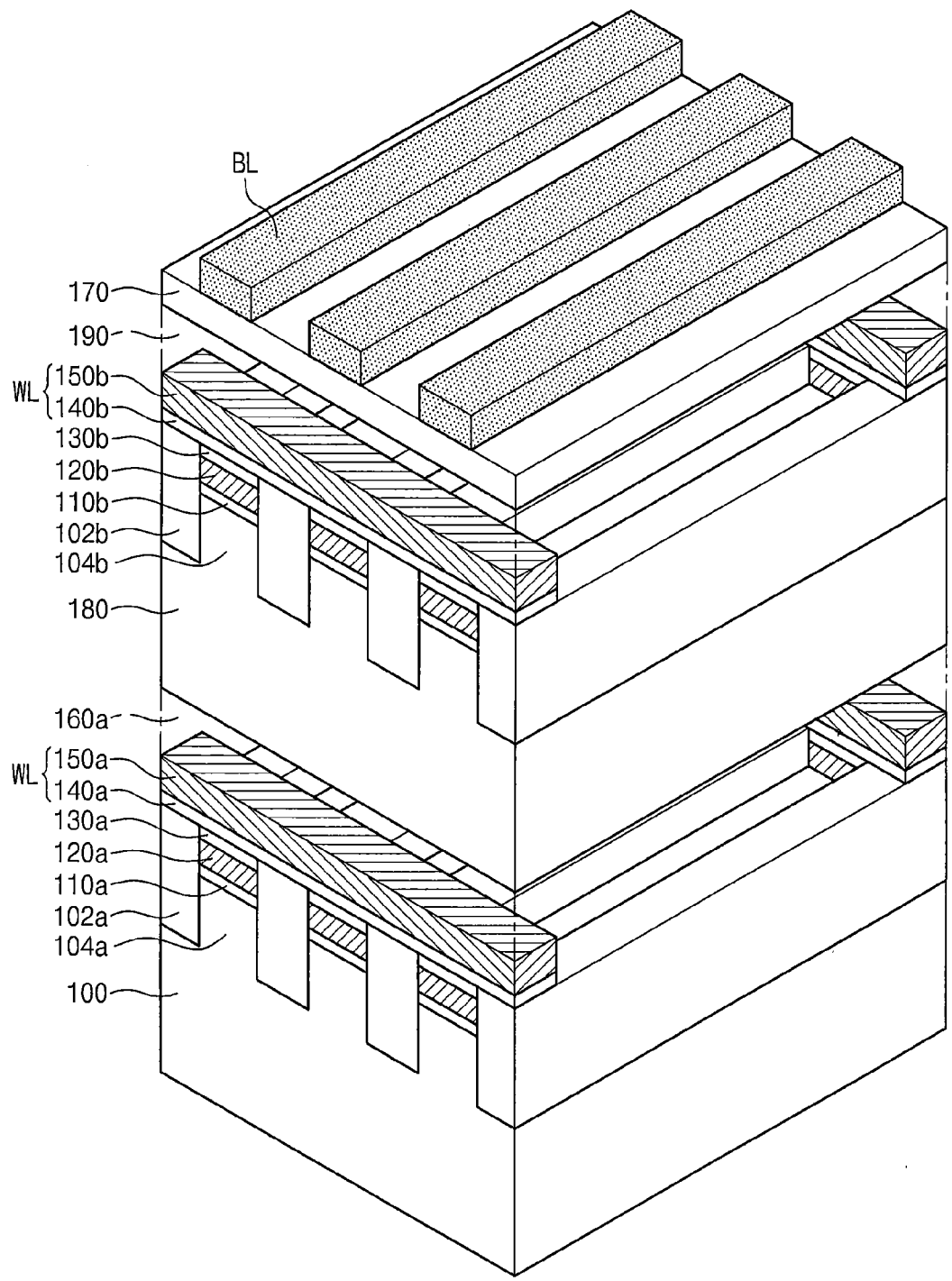

FIG. 8 is a perspective view illustrating a non-volatile memory device according to further other embodiments of the present invention.

Referring to FIG. 8, a memory cell array may be multilayered. A device isolation layer 102a is formed on a semiconductor substrate 100 to define first active regions 104a. The device isolation layer 102a may be formed by using an STI technique. The top of the device isolation layer 102a may be higher than that of the first active regions 104a. A tunnel insulation layer 110a may be formed on the first active region 104a. The tunnel insulation layer 110a may be formed using a thermal oxide process. First charge storage patterns 120a may be formed on the tunnel insulation layer 110a. The first charge storage patterns 120a may be separated from adjacent first charge storage patterns 120. That is, the first charge storage patterns 120a formed on the first active regions 104a may be separated from each other. The charge storage patterns 120a may be disposed between adjacent first device isolation layers 102a. Accordingly, tops of the first charge storage patterns 120a may be lower than that of the device isolation layer 102a. First interface layer patterns 130a may be disposed on the first charge storage patterns 120a. Top of the first interface layer patterns 130a may be substantially even with tops of the first device isolation layer 102a. Additionally, first interface layer patterns 130a are separated from other first interface layer patterns 130a disposed on an adjacent active regions 104a.

A first blocking insulation pattern 140a and a first control gate electrode 150a are sequentially disposed on the first interface layer patterns 130a and the first device isolation layer 102a. The first interface layer patterns 130a may reduce transfer of charges stored in the charge storage pattern 120a. When the first blocking insulation pattern 140a includes a high-k dielectric layer, the first interface layer pattern 130a may reduce a leakage current between the first control gate electrode 150a and the first charge storage pattern 120a. The first interface layer pattern 130a may be formed of a material that improves an interface junction characteristic between the first blocking insulation pattern 140a and the first charge storage patterns 120a. A lower interlayer insulation layer 160a may be formed on the first control gate electrode(s) 150a.

A silicon single crystalline layer 180 may be formed on or bonded to a semiconductor substrate 100 having the lower interlayer insulation layer 160a. A second device isolation layer 102b is formed in the silicon single crystalline layer 180 to define second active regions 104b. The second device isolation layer 102b may be formed using an STI technique. The top of the second device isolation layer 102b is higher than that of the second active regions 104b. A second tunnel insulation layer 110b is formed on the second active regions 104b. The second tunnel insulation layer 110b may be formed using a thermal oxide process. Second charge storage patterns 120b are formed on the second tunnel insulation layers 110b. Each second charge storage pattern 120b may be separated from adjacent second charge storage patterns 120b. That is, the second charge storage patterns 120b formed on the second active regions 104b are separated from each other. The second charge storage pattern 120b may be disposed between adjacent second device isolation layers 102b. Accordingly, the top of the second charge storage patterns 120b may be lower than that of the second device isolation layer 102b. Second interface layer patterns 130b may be disposed on the second charge storage patterns 120b. The top of the second interface layer pattern 130b may be substantially even with tops of the second device isolation layer 102b. Additionally, each second interface layer pattern 130b may be separated from other second interface layer patterns 130b disposed on an adjacent second active region 104b.

A second blocking insulation pattern 140b and a second control gate electrode 150b are sequentially disposed on the second interface layer patterns 130b and the second device isolation layer 102b. The second interface layer patterns 130b may reduce transfer of charges stored in the second charge storage pattern 120b. That is, when the second blocking insulation pattern 140b includes a high-k dielectric layer, the second interface layer patterns 130b may reduce a leakage current between the second control gate electrode 150b and the second charge storage pattern 120b. The second interface layer pattern 130b may be formed of a material for that improves an interface junction characteristic between the second blocking insulation pattern 140b and the second charge storage pattern 120b. An upper interlayer insulation layer 190 may be formed on the second control gate electrode(s) 150b. A bit line(s) BL may be formed on the upper interlayer insulation layer 190.

FIGS. 9 through 13 are cross-sectional views illustrating a non-volatile memory devices according to embodiments of the present invention.

Figure 9:
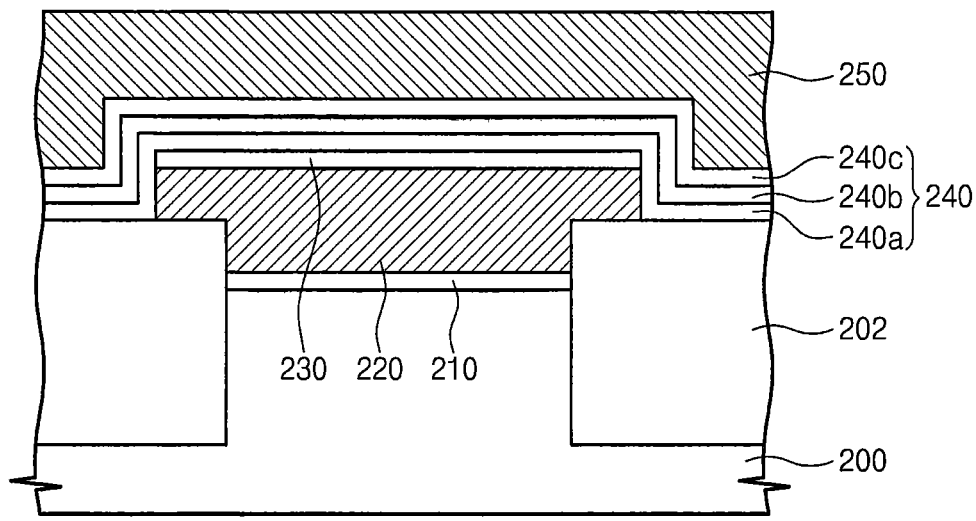
FIGS. 9 through 13 are cross-sectional views illustrating a non-volatile memory device according to embodiments of the present invention.

Referring to FIG. 9, a device isolation layer 202 may be formed on/in a semiconductor substrate 200 to define an active region 204. The device isolation layer 202 may be formed using a shallow trench isolation (STI) technique. The top of the device isolation layer 202 may be higher than that of the active region 204. A tunnel insulation layer 210 may be formed on the active region 204. The tunnel insulation layer 210 may be formed using a thermal oxide process. A charge storage pattern 220 is formed on the tunnel insulation layer 210. The charge storage pattern 220 may be separated from adjacent charge storage patterns 220. The charge storage patterns 220 formed on the active regions 204 are separated from each other. The top of the charge storage pattern 220 may be higher than that of the device isolation layer 202. An interface layer pattern 230 is formed on the charge storage pattern 220. Sidewalls of the upper portion of the charge storage pattern 220 and sidewalls of the interface layer pattern 230 may be substantially aligned with each other. The interface layer pattern 230 may be formed of a dielectric or a conductor. In greater detail, if the interface layer pattern 230 is formed of a dielectric, it may be formed by oxidizing a top portion of the charge storage pattern 220 before patterning the charge storage pattern 220. If the charge storage pattern 220 is formed of polysilicon, the interface layer pattern 230 may be formed of a metal silicide, or by depositing a material providing an improved interface characteristic on the charge storage pattern 220.

A blocking insulation pattern 240 and a control gate electrode 250 are sequentially disposed on the interface layer pattern 230 and on the device isolation layer 202. The interface layer pattern 230 reduces transfer of charges stored in the charge storage pattern 220. That is, when the blocking insulation pattern 240 includes a high-k dielectric layer, the interface layer pattern 230 may reduce a leakage current between the gate electrode 250 and the charge storage pattern 220. The interface layer pattern 230 may be formed of a material that improves an interface junction characteristic between the blocking insulation pattern 240 and the charge storage pattern 220. The blocking insulation pattern 240 may include a first blocking insulation pattern 240a, a second blocking insulation pattern 240b, and a third blocking insulation pattern 240c. The first and third blocking insulation patterns 240a and 240c may be formed of a same material. Permittivities of the first and third blocking insulation patterns 240a and 240c may be greater than a permittivity of the second blocking insulation pattern 240b. For example, the second blocking insulation pattern 240b is formed of a silicon oxide layer and each of the first and third blocking insulation patterns 240a and 240c may be formed of a high-k dielectric layers such as an aluminum oxide layer.

Figure 10:
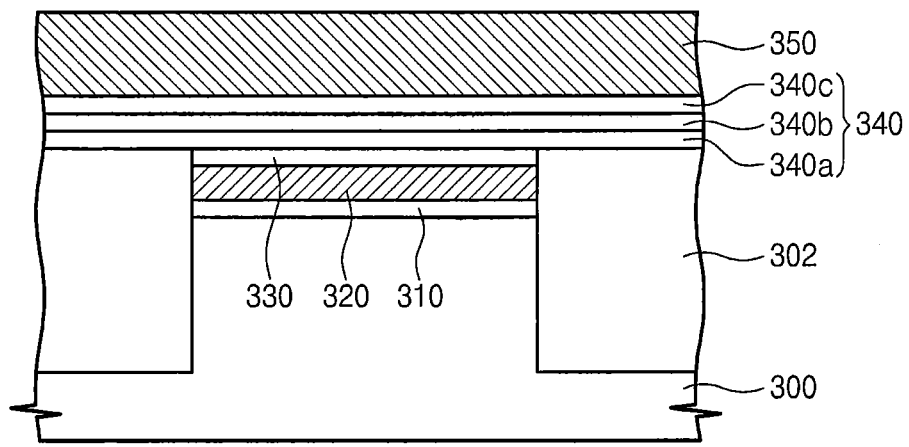

Referring to FIG. 10, a device isolation layer 302 is formed on/in a semiconductor substrate 300 to define an active region 304. The device isolation layer 302 may be formed using an STI technique. The top of the device isolation layer 302 may be higher than that of the active region 304. A tunnel insulation layer 310 may be formed on the active region 304. The tunnel insulation layer 310 may be formed using a thermal oxide process. A charge storage pattern 320 may be formed on the tunnel insulation layer 310. The charge storage pattern 320 may be separated from a adjacent charge storage patterns 320. That is, charge storage patterns 320 formed on the active regions 304 may be separated from each other. A top of the charge storage pattern 320 may be lower than that of the device isolation layer 302. The top of an interface layer pattern 330 may be substantially even with a top of the device isolation layer 302. A blocking insulation pattern 340 and a control gate electrode 350 may be sequentially disposed on the interface layer pattern 330 and the device isolation layer 302. The interface layer pattern 330 may reduce transfer of charges stored in the charge storage pattern 320. The interface layer pattern 330 may be formed of a conductor, a semiconductor, or a dielectric. The charge storage pattern 320 may be formed of polysilicon, and the interface layer pattern 330 may be formed of a silicon oxide layer (i.e., a dielectric layer), and the silicon oxide layer may be formed using a thermal oxide process. If the interface layer pattern 330 is a conductor, the interface layer pattern 330 may be formed using a metal silicide process. In greater detail, the interface layer pattern 330 may be formed using a silicide process. The interface layer pattern 330 is not limited to metal silicide and may include another conductive layer that may reduce a leakage current.

If the blocking insulation pattern 340 includes a high-k dielectric layer, the interface layer pattern 330 can reduce a leakage current between the control gate electrode 350 and the charge storage pattern 320. The interface layer pattern 330 may be formed of a material that improves an interface junction characteristic between the blocking insulation pattern 340 and the charge storage pattern 320. The blocking insulation pattern 340 may include a first blocking insulation pattern 340a, a second blocking insulation pattern 340b, and a third blocking insulation pattern 340c. The first blocking insulation pattern 340a and the third blocking insulation pattern 340c may be formed of a same material. Permittivities of the first blocking insulation pattern 340a and the third blocking insulation pattern 340c may be higher than a permittivity of the second blocking insulation pattern 340b. For example, the second blocking insulation pattern 340b may be formed of a silicon oxide layer and each of the first and third blocking insulation patterns 340a and 340c may be formed of a high-k dielectric layer such as an aluminum oxide layer. That is, high-k dielectric layers may be used as the first and third blocking insulation patterns 340a and 340c such that a coupling ratio may be increased. A silicon oxide layer may be used as the second blocking insulation pattern 340b to reduce leakage current.

According to modified embodiments of the present invention, the first and third blocking insulation patterns 340a and 340c may be formed of respective different materials. For example, the first blocking insulation pattern may be formed of an aluminum oxide layer and the third blocking insulation pattern may be formed of a hafnium oxide layer.

Figure 11:
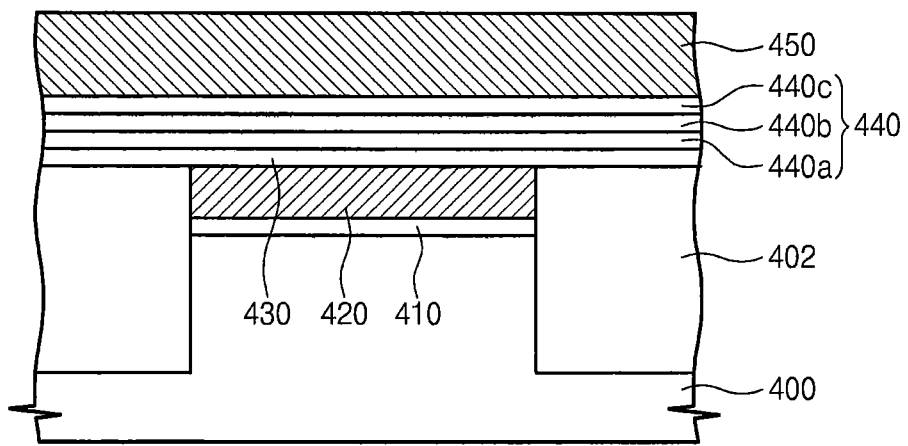

Referring to FIG. 11, a device isolation layer 402 is formed in a semiconductor substrate 400 to define an active region 404. The device isolation layer 402 may be formed using an STI technique. The top of the device isolation layer 402 may be higher than that of the active region 404. A tunnel insulation layer 410 may be formed on the active region 404. The tunnel insulation layer 410 may be formed using a thermal oxide process. A charge storage pattern 420 may be formed on the tunnel insulation layer 410. The charge storage pattern 420 may be separated from adjacent charge storage patterns 420. That is, charge storage patterns 420 formed on the active regions 404 may be separated from each other. The top of the charge storage pattern 420 may be substantially even with the top of the device isolation layer 402. The blocking insulation pattern 440 and the control gate electrode 450 may be sequentially disposed on the interface layer pattern 430 and the device isolation layer 402. The interface layer pattern 430 may reduce transfer of charges stored in the charge storage pattern 420. The interface layer pattern 430 may be formed of a dielectric. The charge storage pattern 420 may be formed of polysilicon, and the interface layer pattern 440 may be formed of a dielectric layer such as silicon oxide layer.

If the blocking insulation pattern 440 includes a high-k dielectric layer, the interface layer pattern 430 may reduce a leakage current between the control gate electrode 450 and the charge storage pattern 420. The interface layer pattern 430 may be formed of a material that improves an interface junction characteristic between the blocking insulation pattern 440 and the charge storage pattern 420. The blocking insulation pattern 440 may include a first blocking insulation pattern 440a, a second blocking insulation pattern 440b, and a third blocking insulation pattern 440c. The first blocking insulation pattern 440a and the third blocking insulation pattern 440c may be formed of a same material. Permittivities of the first blocking insulation pattern 440a and the third blocking insulation pattern 440c may be higher than a permittivity of the second blocking insulation pattern 440b. For example, the second blocking insulation pattern 440b may be formed of a silicon oxide layer and each of the first and third blocking insulation pattern 440a and 440c may be formed of a high-k dielectric layer such as an aluminum oxide layer.

Figure 12:
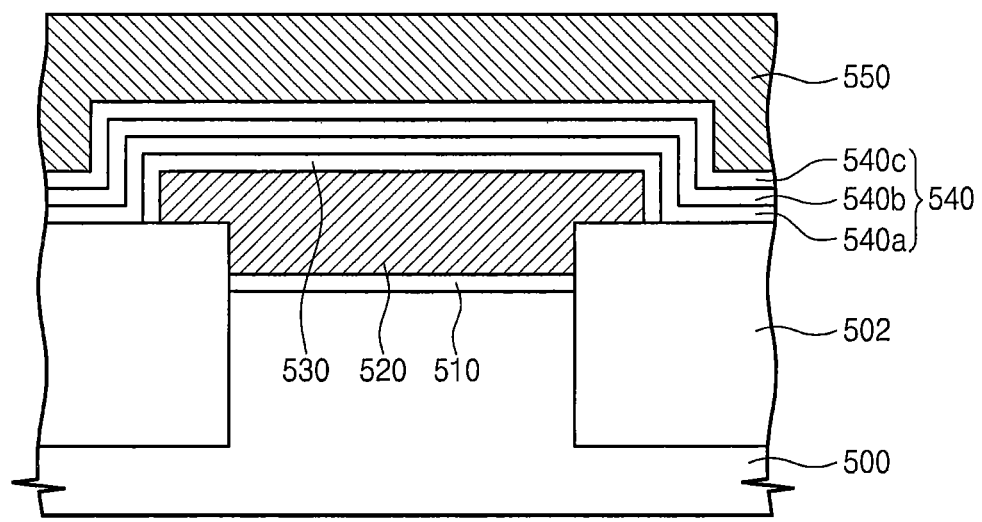

Referring to FIG. 12, a device isolation layer 502 is formed on/in a semiconductor substrate 500 to define an active region 504. The device isolation layer 502 may be formed using an STI technique. The top of the device isolation layer 502 may be higher than that of the active region 504. A tunnel insulation layer 510 may be formed on the active region 504. The tunnel insulation layer 510 may be formed using a thermal oxide process. A charge storage pattern 520 may be formed on the tunnel insulation layer 510. The charge storage pattern 520 may be separated from adjacent charge storage patterns 520. That is, charge storage patterns 520 formed on the active regions 504 may be separated from each other. The top of the charge storage pattern 520 may be higher than a top of the device isolation layer 502. The charge storage pattern 520 may be separated from the device isolation layer 502. The interface layer pattern 530 may be formed on the top surface and sidewalls of the charge storage pattern 520. The interface layer pattern 530 may be formed of a dielectric and/or a conductor. In greater detail, if the interface layer pattern 530 is formed of a dielectric, it may be formed by oxidizing a portion of the top surface and sidewalls of the charge storage pattern 520. If the charge storage pattern 520 is formed of polysilicon, the interface layer pattern 530 may be formed of metal silicide.

A blocking insulation pattern 540 and a control gate electrode 559 are sequentially formed on the interface layer pattern 530 and the device isolation layer 502. The interface layer pattern 530 may reduce transfer of charges stored in the charge storage pattern 520. If the blocking insulation pattern 540 includes a high-k dielectric layer, the interface layer pattern 530 can reduce a leakage current between the control gate electrode 550 and the charge storage pattern 520. The interface layer pattern 530 may be formed of a material that improves an interface junction characteristic between the blocking insulation pattern 540 and the charge storage pattern 520. The blocking insulation pattern 540 may include a first blocking insulation pattern 540a, a second blocking insulation pattern 540b, and a third blocking insulation pattern 540c. The first blocking insulation pattern 540a and the third blocking insulation pattern 540c may be formed of the same material. Permittivities of the first blocking insulation pattern 540a and the third blocking insulation pattern 540c may be higher a permittivity that of the second blocking insulation pattern 540b. For example, the second blocking insulation pattern 540b may be formed of a silicon oxide layer and each of the first and third blocking insulation patterns 540a and 540c may be formed of a high-k dielectric layer such as an aluminum oxide layer.

Figure 13:
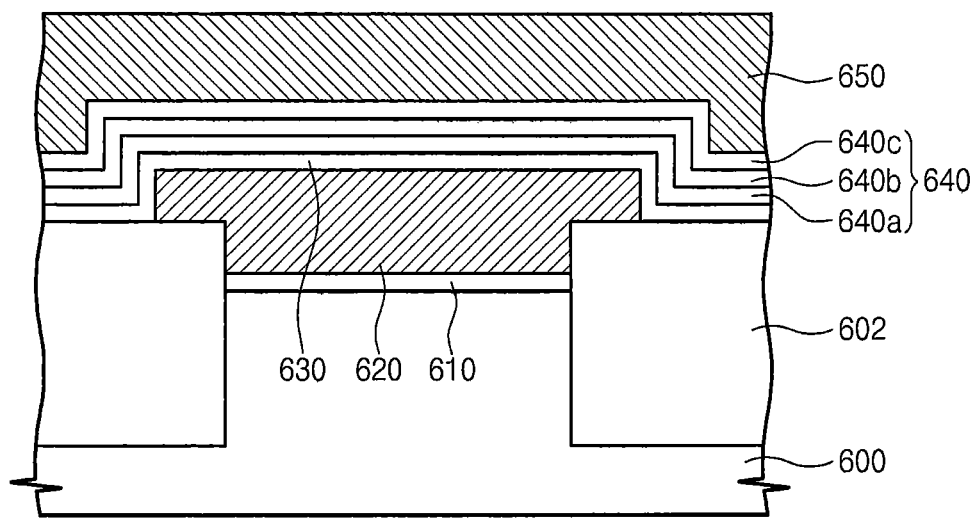

Referring to FIG. 13, a device isolation layer 602 is formed on/in a semiconductor substrate 600 to define an active region 604. The device isolation layer 602 may be formed using an STI technique. The top of the device isolation layer 602 may be higher than that of the active region 604. The tunnel insulation layer 610 may be formed on the active region 604. The tunnel insulation layer 610 may be formed using a thermal oxide process. The charge storage pattern 620 may be formed on the tunnel insulation layer 610. The charge storage pattern 620 may cover a portion of the top of the device isolation layer 602. The charge storage pattern 620 may be separated from adjacent charge storage patterns 620. That is, charge storage patterns 620 formed on the active regions 604 may be separated from each other. A top surface of the charge storage pattern 620 may be higher than that of the device isolation layer 602. The interface layer pattern 630 is formed on the top surface of the charge storage pattern 620, sidewalls of the upper portion of the charge storage pattern 620, and the device isolation layer 602 and extends thereon. The interface layer pattern 630 may be a dielectric. In greater detail, the interface layer pattern 630 may be formed of a silicon oxide layer.

A blocking insulation pattern 640 and a control gate electrode 650 are sequentially-stacked on the interface layer pattern 630 and the device isolation layer 602. The interface layer pattern 630 may reduce transfer of charges stored in the charge storage pattern 620. If the blocking insulation pattern 640 includes a high-k dielectric layer, the interface layer pattern 630 may reduce a leakage current between the control gate electrode 650 and the charge storage pattern 620. The interface layer pattern 630 may be formed of a material that improves an interface junction characteristic between the blocking insulation pattern 640 and the charge storage pattern 620. The blocking insulation pattern 640 may include a first blocking insulation pattern 640a, a second blocking insulation pattern 640b, and a third blocking insulation pattern 640c. The first blocking insulation pattern 640a and the third blocking insulation pattern 640c may be formed of a same material. Permittivities of the first blocking insulation pattern 640a and the third blocking insulation pattern 640c may be higher than a permittivity of the second blocking insulation pattern 640b. That is, the second blocking insulation pattern 640b may be formed of a silicon oxide layer and the first and third blocking insulation pattern 640a and 640c may be formed of a high-k dielectric layer such as an aluminum oxide layer.

Referring to FIGS. 9 through 13, the control gate electrodes 650, 550, 450, 350, and 250 may include at least one of sequentially-stacked barrier metal/high work function metal, sequentially-stacked high work function metal/barrier metal/metal, sequentially-stacked doped polysilicon/barrier metal/metal, sequentially-stacked metal/doped polysilicon, metal, and/or doped polysilicon. A barrier metal may include at least one of a metal nitride layer and a metal oxide nitride layer. A high work function metal may be a conductive material whose work function is greater than 4 eV. For example, a high work function metal may include at least one of TaN, W, WN, TiN, and/or $CoSi_x$.

FIGS. 14A through 14D are cross-sectional views illustrating operations of fabricating a non-volatile memory device according to some embodiments of the present invention. Moreover, FIGS. 14A through 14D are taken along lines I-I' and II-II' of FIG. 3A.

Referring to FIG. 14A, the non-volatile memory device may be formed using self aligned shallow trench isolation. In greater detail, a tunnel insulation layer 410 and a charge storage layer 420 are stacked on a semiconductor substrate 400. The charge storage layer 420, the tunnel insulation layer 410, and the semiconductor substrate 400 are sequentially patterned to form a trench 403. As a result, the tunnel insulation layer 410 and the charge storage pattern 420 are formed on the semiconductor substrate 400, and the trench 403 is aligned with sidewalls of the charge storage pattern 420.

Figure 14B:
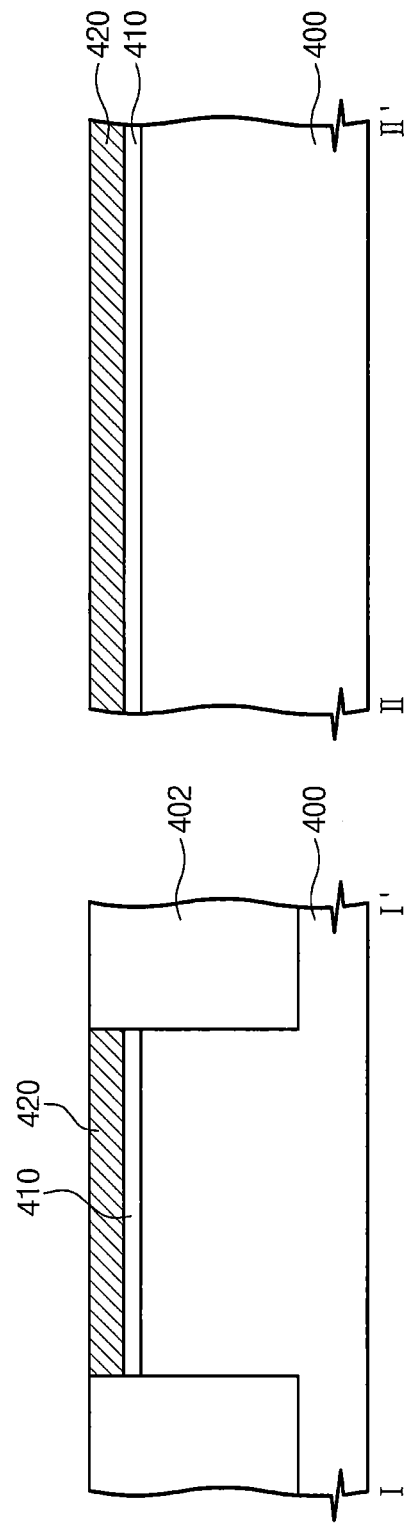

Referring to FIG. 14B, an insulation layer is filled in the trench 403 to form the device isolation layer 402. The insulation layer is planarized using etch back and/or chemical mechanical polishing (CMP), and then removed until the charge storage pattern 420 is exposed. As a result, the charge storage pattern 420 is provided on an active region between the device isolation layers 402. The top of the charge storage pattern 420 may have substantially the same height as that of the device isolation layer 402.

Figure 14C:
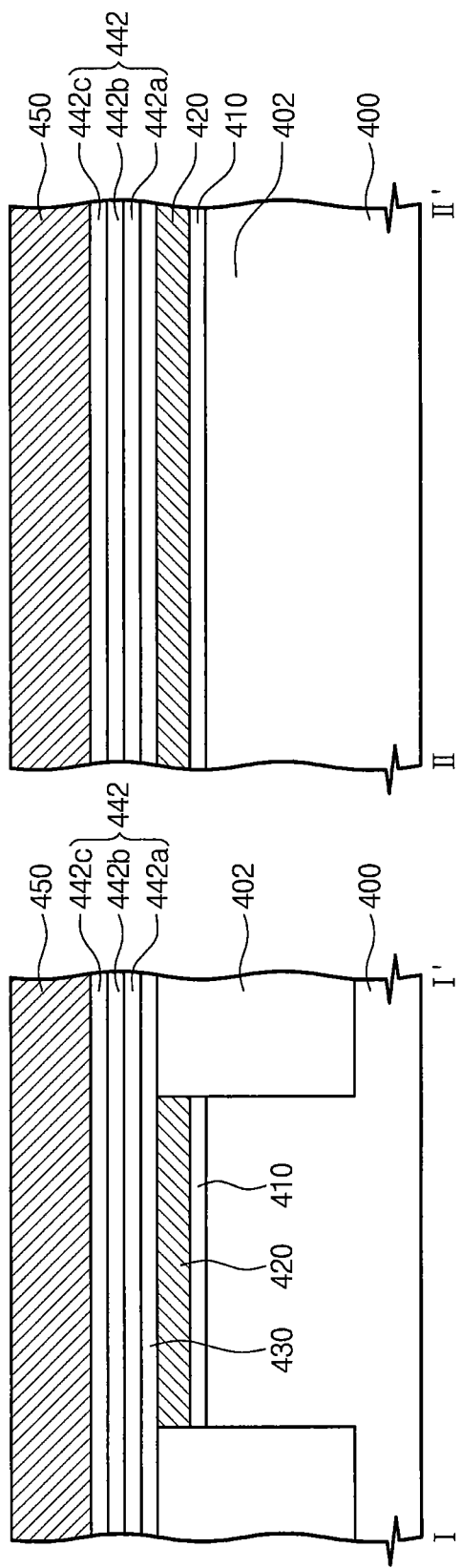

Referring to FIG. 14C, an interface layer 430 and a blocking insulation layer 442 are sequentially formed on an entire surface of the resulting structure where the charge storage pattern 420 is formed. The interface layer 430 may be a conductor, a semiconductor, or a dielectric. The interface layer 430 may include at least one of a silicon oxide layer, a silicon nitride layer, and/or a silicon oxide nitride layer.

A blocking insulation layer 442 is formed on the interface layer 430. The blocking insulation layer 442 may include a high-k dielectric material and may be formed of a multilayer of at least one layer selected from an aluminum oxide layer, a yttrium oxide layer, a hafnium oxide layer, a tantalum oxide layer, a zirconium oxide layer, and/or a titanium oxide layer. At this point, the blocking insulation layer 430 may be formed with an equivalent oxide thickness (EOT) to provide a required coupling ratio. Generally, a non-volatile memory device requires an EOT in the range of about 60 Å (Angstroms) to 150 Å (Angstroms).

The blocking insulation layer 442 includes a first blocking insulation layer 442a, a second blocking insulation layer 442b, and a third blocking insulation layer 442c, which are sequentially-stacked. A permittivity of the second blocking insulation layer 442b may be less than permittivities of the first blocking insulation layer 442a and the third blocking insulation layer 442c. For example, the first blocking insulation layer 442a and the third blocking insulation layer 442c may be formed of a high-k dielectric material, and the second blocking insulation layer 442b may be formed of a silicon oxide layer.

The first blocking insulation layer 442a or the third blocking insulation layer 442c may include at least one of a metal oxide layer, a metal nitride layer, and/or a metal oxide nitride layer, each of which has a higher permittivity than a silicon oxide layer. The second blocking insulation layer 442b may include at least one of a silicon oxide layer, a silicon oxide nitride layer, a silicon nitride layer, a metal oxide layer, a metal nitride layer, and/or a metal oxide nitride layer.

A control gate conductive layer 450 is formed on the blocking insulation layer 442. Although the control gate conductive layer 450 may be formed, for example, of polysilicon, it may also be formed of a single layer or a multilayer of metal, a conductive metal nitride layer, and/or a conductive oxide layer. The control gate conductive layer 450 may include at least one of sequentially-stacked barrier metal/high work function metal, sequentially-stacked high work function metal/barrier metal/metal, sequentially-stacked doped polysilicon/barrier metal/metal, sequentially-stacked metal/doped polysilicon, metal, and/or doped polysilicon. A barrier metal may include a metal nitride layer.

Referring to FIG. 14d, the control gate conductive layer 450, the blocking insulation layer 442, the interface layer 430, and the charge storage pattern 420 are patterned to form a control gate electrode 450, a blocking insulation pattern 440, an interface layer pattern 430, and a charge storage pattern 420.

Figure 15A:
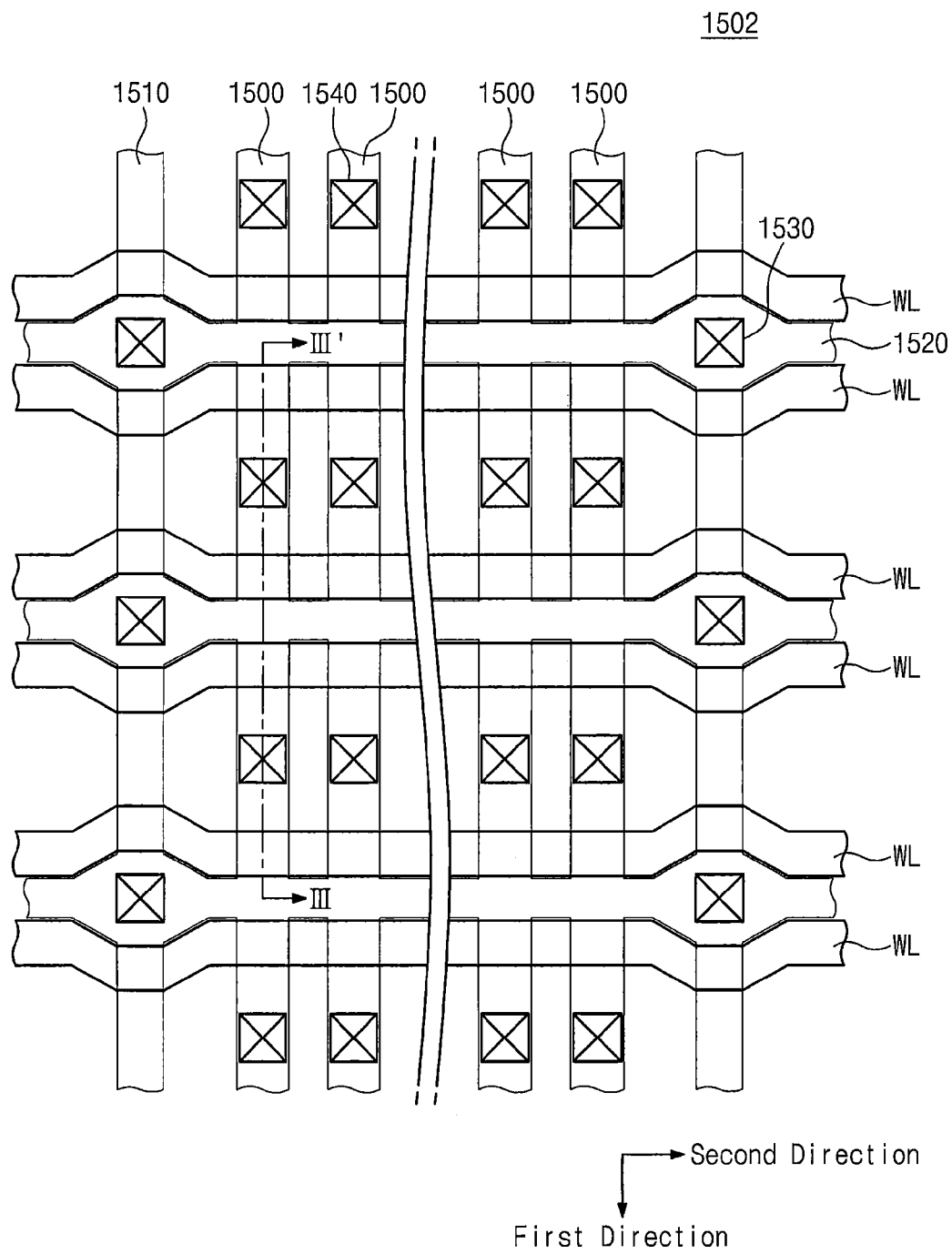
FIGS. 15A and 15B are respective plan and cross sectional views illustrating a NOR non-volatile memory device according to embodiments of the present invention.
Figure 15B:
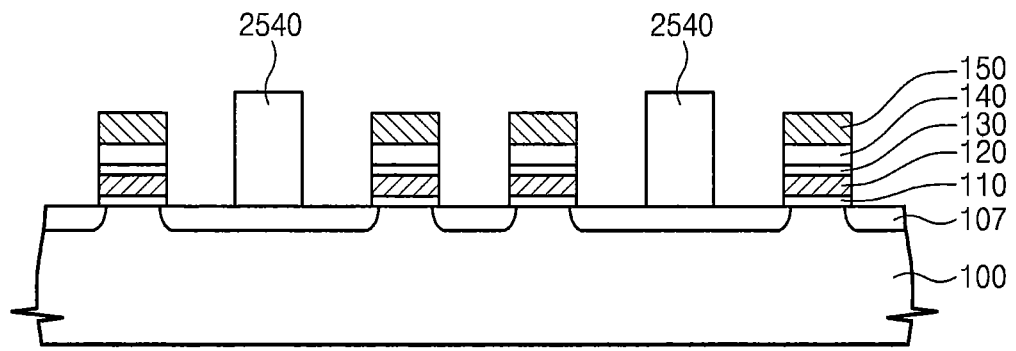

FIGS. 15A and 15B are respective plan and cross sectional views illustrating a NOR non-volatile memory device according to embodiments of the present invention. FIG. 15B is a cross-sectional view taken along a line III-III' of FIG. 15A.

Referring to FIGS. 15A and 15B, the NOR non-volatile memory device includes a semiconductor substrate 100 having a cell region. A device isolation layer defines active regions 1500, 1510, and 1520. The first active regions 1500 are laterally arranged in a first direction. Source strapping active regions 1510 are regularly arranged in the first direction at both sides of the first active regions 1500. Second active regions 1520 crossing over the first active regions 1500 are laterally arranged in a second direction. The second active regions 1520 serve as source lines.

A pair of word lines WL crosses over the first active regions 1500 and the source strapping active regions 1510 and extend in the second direction. Active regions disposed on the both sides of the pair of word lines WL become drains of a transistor, and an active region between the pair of word lines WL becomes a source of the transistor. The drain of the transistor is electrically connected to a bit line through a bit line contact plug 1540.

Moreover, the sources of the transistor are electrically connected to sources adjacent in the second direction through the second active region 1520. Therefore, the second active region 1520 serves as a source line. A source contact 1530 is formed at a position where the second active region 1520 and the source strapping active region 1510 intersect.

The word line WL may include a tunnel insulation layer 110, a charge storage pattern 120, an interface layer pattern 130, a blocking insulation pattern 140, and a control gate electrode 150, which are sequentially-stacked on the semiconductor substrate 100. The interface layer pattern 130 reduces transfer of charges stored in the charge storage pattern 120. That is, because the blocking insulation pattern 140 is formed of a high-k dielectric layer, the interface layer pattern 130 can reduce a leakage current between the control gate electrode 150 and the charge storage pattern 120. The interface layer pattern 130 may be formed of a material that improves an interface junction characteristic between the blocking insulation layer 140 and the charge storage pattern 120.

The charge storage pattern 120 may be formed of polysilicon. The polysilicon may be in-situ doped polysilicon during a deposition process. The charge storage pattern 120 is not limited to polysilicon and may include at least one of doped silicon, metal, and/or a metal compound.

The interface layer pattern 130 may include at least one of a dielectric, a conductor, and/or a semiconductor. If the interface layer pattern 130 is a dielectric, it may include at least one of a silicon oxide layer, a silicon nitride layer, and/or a silicon oxide nitride layer. For example, the charge storage pattern 120 may be formed of polysilicon, the blocking insulation pattern 140 may includes an aluminum oxide layer, and the interface layer pattern 130 may be formed of a silicon oxide layer.

The blocking insulation pattern 140 may include a high-k dielectric layer. The high-k dielectric layer may be a material having a higher permittivity than a silicon oxide layer. The high-k dielectric layer may increase the above-mentioned coupling ratio. The blocking insulation pattern 140 may include a first blocking insulation pattern, a second blocking insulation pattern, and a third blocking insulation pattern, which are sequentially-stacked. The permittivity of the second blocking insulation pattern may be less than permittivities of the first and third blocking insulation patterns. For example, aluminum oxide layers may be used for the first and third blocking insulation patterns, and a silicon oxide layer may be used for the second blocking insulation pattern. The blocking insulation pattern may further include a fourth blocking insulation pattern on the third blocking insulation pattern. The fourth blocking insulation pattern may include the same material as the second blocking insulation pattern. The first blocking insulation pattern may include at least one of a metal oxide layer, a metal nitride layer, and/or a metal oxide nitride layer, each of which has a higher permittivity than a silicon oxide layer. The metal oxide layer may include at least one of an aluminum oxide layer, a hafnium oxide layer, a zirconium oxide layer, and/or a hafnium aluminum oxide layer. The second blocking insulation pattern may include at least one of a silicon oxide layer, a silicon oxide nitride layer, a silicon nitride layer, a metal oxide layer, a metal nitride layer, and/or a metal oxide nitride layer.

The control gate electrode 150 may include at least one of sequentially-stacked barrier metal/high work function metal, sequentially-stacked high work function metal/barrier metal/metal, sequentially-stacked doped polysilicon/barrier metal/metal, sequentially-stacked metal/doped polysilicon, metal, and/or doped polysilicon. A barrier metal may include at least one of a metal nitride layer and/or a metal oxide nitride layer.

According to additional embodiments of the present invention, the non-volatile memory device may be included in an electronic system. Electronic systems will be described with reference to FIG. 16.

Figure 16:
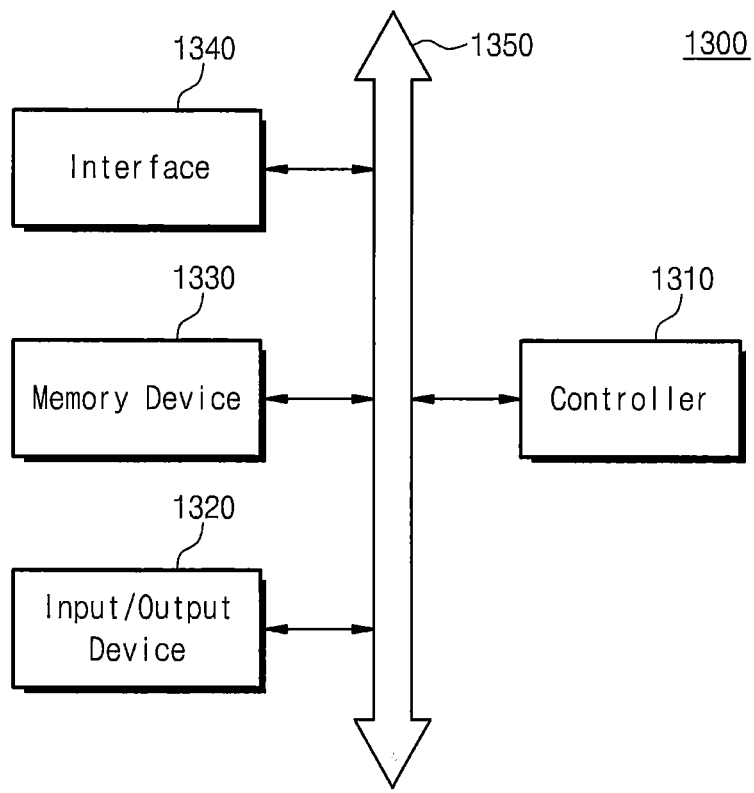
FIG. 16 is a block diagram illustrating an electronic system with a non-volatile memory device according to embodiments of the present invention.

FIG. 16 is a block diagram illustrating an electronic system with a non-volatile memory device according to some embodiments of the present invention.

Referring to FIG. 16, electronic system 1300 may include a controller 1310, an input/output device 1320, and a memory device 1330, all of which may be connected to each other through a bus 1350. The bus 1350 provides a path through which data can be transferred. The controller 1310 may include at least one of a microprocessor, a digital signal processor, a microcontroller, and/or logic devices capable performing similar functions thereof. The input/output device 1320 may include at least one of a keypad and a display device. The memory device 1330 is a device that stores data. The memory device 1330 may store data or commands that can be executed by the controller 1310. The memory device 1330 may include at least one of the non-volatile memory devices disclosed in the above mentioned embodiments. The electronic system 1300 may further include an interface 1340 to transmit data to a communication network and/or receive data from the communication network. The interface 1340 may be coupled to the network via a wired and/or wireless coupling. For example, the interface 1340 may include an antenna or a wired/wireless transceiver.

The electronic system 1300 may be a mobile system, a personal computer, an industrial computer, and/or a system that performs various functions. For example, the mobile system may be a personal digital assistant (PDA), a portable computer, a web tablet, a mobile phone, a wireless phone, a laptop computer, a memory card, a digital music system, or an information transmitting/receiving system. If the electronic system 1300 is equipment used for wireless communication, it may include a communication interface protocol for third generation communication systems such as Code Division Multiple Access (CDMA), Global System for Mobile Communications (GSM), North American Digital Cellular (NADC), Extended-Time Division Multiple Access (E-TDMA), and CDMA2000.

Next, a memory card according to embodiments of the present invention will be described with reference to FIG. 17.

Figure 17:
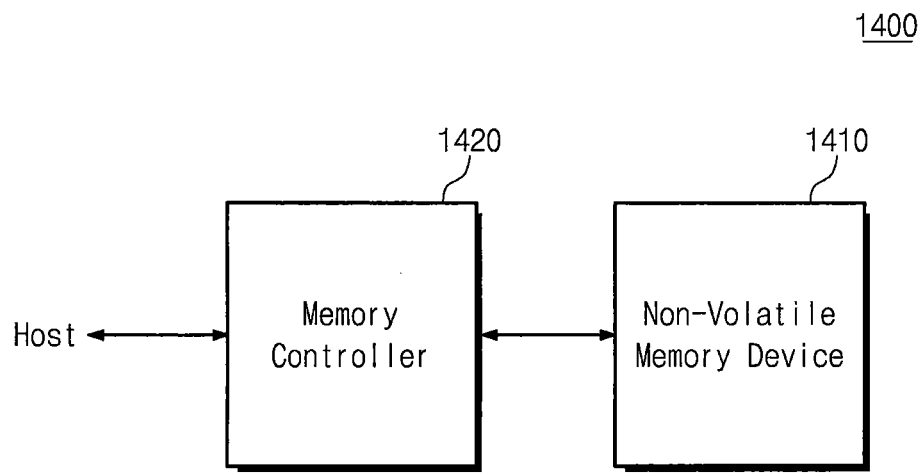
FIG. 17 is a block diagram illustrating a memory card with a non-volatile memory device according to embodiments of the present invention.

Referring to FIG. 17, the memory card 1400 includes a non-volatile memory device 1410 and a memory controller 1420. The non-volatile memory device 1410 can store data and read the stored data. The non-volatile memory device 1410 includes at least one of the non-volatile memory devices disclosed in the above-mentioned embodiments. The memory controller 1420 controls the non-volatile memory device (e.g., a flash memory device) 1410 to read stored data or store data therein in response to a read/write request of a host.

A charge trap flash memory includes a charge storage pattern that has an insulating material interposed between a control gate electrode and a semiconductor substrate. A tunnel insulation pattern is formed between the charge storage pattern and the semiconductor substrate, and a blocking insulation pattern is formed between the charge storage pattern and the control gate electrode. The charge storage pattern has a trap site for storing electric charges. Whether electric charges are charged in the trap site or not is determined by information stored in the charge trap flash memory.

The charge trap flash memory may reduce a parasitic capacitance and a coupling coefficient of a control gate when compared to a flash memory with a floating gate. Additionally, the charge trap flash memory should maintain a certain state stored in the charge storage pattern for a predetermined time (a retention time).

While an erase operation is performed in a charge trap flash memory with a silicon/oxide/nitride/oxide/silicon (SONOS) cell structure, a back tunneling current may occur through a blocking insulation pattern such that an operating speed of the erase operation may be reduced. By using a high-k dielectric insulation layer as the blocking insulation pattern, an electric field applied to the high-k dielectric insulation layer can be reduced. A charge trap flash memory may be provided with a TaN/Al$_2$O$_3$/Nitride/Oxide/Silicon (TANOS) cell structure. Back tunneling current flowing through a high-k dielectric insulation layer may control an amount of FN tunneling by appropriately adjusting an energy band.

If an aluminum oxide layer Al$_2$O$_3$ is used as the high-k dielectric insulation layer, an electric field applied to the high-k dielectric insulation layer may be reduced and thus the back tunneling current flowing through the high-k dielectric insulation layer can be reduced. Additionally, the back tunneling current can be further reduced by using a conductive material (e.g., TaN, WN, TiN, CoSi$_x$, polysilicon) having a high work function of more than 4.5 eV as the control gate electrode.

On the other hand, since a high-k dielectric insulation layer as the blocking insulation pattern may include a bulk trap density, the bulk trap density can reduce a retention time of the charge storage pattern and reliability of the charge trap flash memory. To increase retention time and/or reliability, a plurality of blocking insulation patterns can be used. The back tunneling current can be adjusted by appropriately controlling an energy band gap of the blocking insulation pattern.

The flash memory with a floating gate structure includes a charge storage pattern that has a conductor interposed between a control gate and a semiconductor substrate. A tunnel insulation pattern is formed between the charge storage pattern and the semiconductor substrate, and a blocking insulation pattern is formed between the charge storage pattern and the control gate electrode. The charge storage pattern may include a floating gate. The floating gate may include a conductive material. Whether electric charges are stored in the floating gate or not determines information stored in the flash memory. The back tunneling current can be adjusted by appropriately controlling an energy band gap of the plurality of blocking insulation patterns.

Figure 18A:
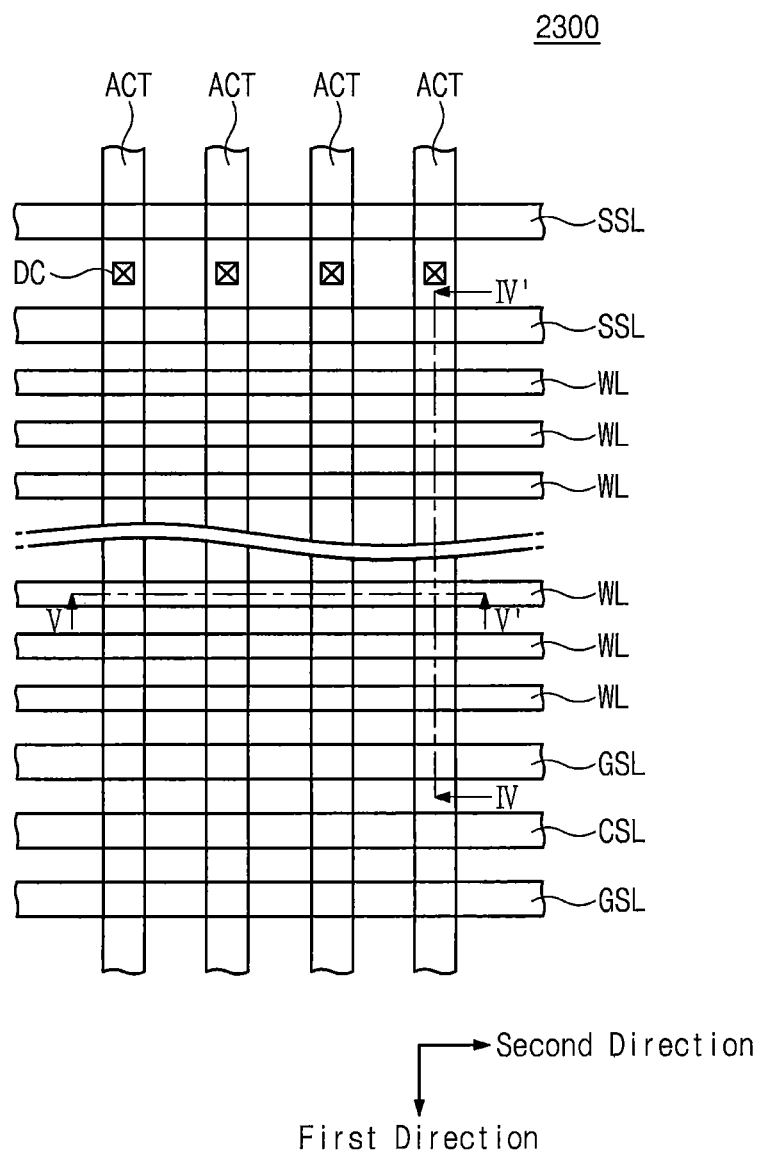
FIGS. 18A and 18B are respective plan and cross sectional views illustrating a NAND non-volatile memory device according to embodiments of the present invention.
Figure 18B:
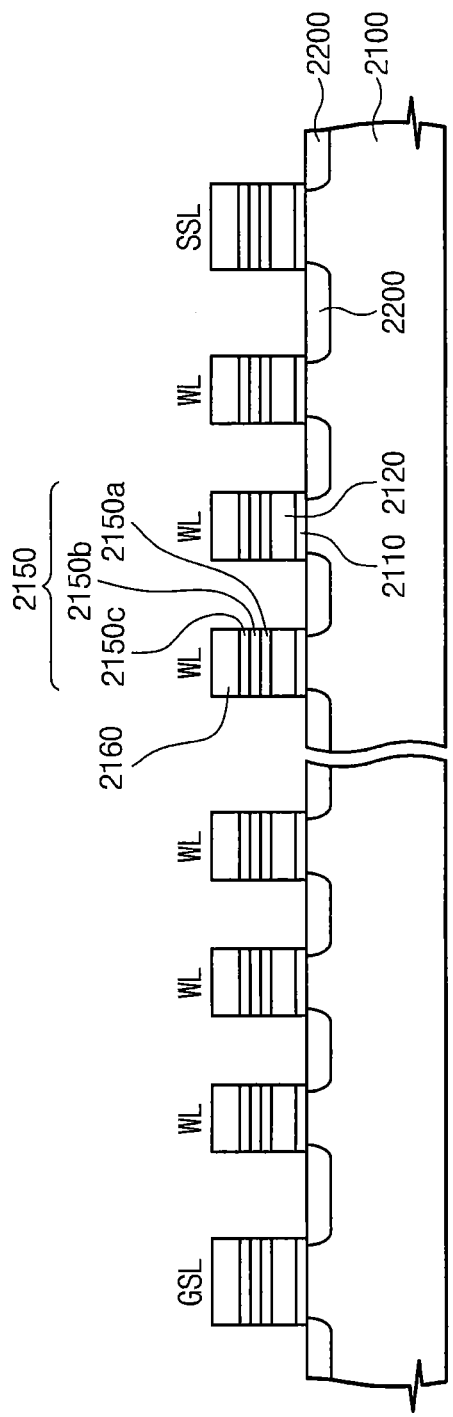

FIGS. 18A and 18B are respective plan and cross sectional views illustrating a NAND non-volatile memory device according to embodiments of the present invention. FIG. 18B is a cross-sectional view taken along a line IV-IV' of FIG. 18A.

Referring to FIGS. 18A and 18B, the NAND non-volatile memory device according to embodiments of the present invention includes a semiconductor substrate 2100 having a cell region. A device isolation layer 2300 is disposed on the semiconductor substrate 2100. The device isolation layer 2300 defines active regions ACT. The active regions ACT are laterally arranged in a first direction. A string selection line SSL and a ground selection line GSL laterally cross over the active regions ACT and also word lines WL laterally cross over the active regions ACT between the string selection line SSL and the ground selection ling GSL. The string selection line SSL, the ground selection line GSL, and the word lines WL laterally extend along a second direction perpendicular to the first direction. The string selection line SSL, the word lines WL, and the ground selection line GSL may be included in a cell string group. Cell string groups may be repeatedly arranged along the first direction in mirror symmetry.

Impurity regions 2200 corresponding to a source and a drain may be disposed on active regions ACT on the both sides of each of the string selection line SSL, the word lines WL, and the ground selection lines GSL. A word line WL and the impurity regions 2200 on the both sides of the word line WL provide a cell transistor. The ground selection line GSL and impurity regions 2200 on the both sides of the ground selection line GSL provide a ground selection transistor GST.

The string selection line SSL and impurity regions 2200 on the both sides of the string selection line SSL provide a string selection transistor SST.

The word line WL may include a tunnel insulation layer 2110, a charge storage pattern 2120, a blocking insulation pattern 2150, and a control gate electrode 2160. A hard mask pattern (not shown) may be disposed on the control gate electrode 2160. The ground selection line GSL and the string selection line SSL may have the same structure as the word line WL. However, the widths of the string selection ling SSL and the ground selection line GSL may be different from that of the word line WL. Especially, the widths of the string selection ling SSL and the ground selection line GSL may be greater than the width of a word lines WL. Layers of the ground and string selection lines GSL and SSL corresponding to the tunnel insulation layer 2110, the charge storage pattern 2120, and the blocking insulation pattern 2150 may be used as a gate insulation layer of the ground and string selection transistors.

The tunnel insulation layer 2110, the charge storage pattern 2120, and the blocking insulation pattern 2150 may extend adjacent another semiconductor substrate. The word lines WL may share the tunnel insulation layer 2110, the charge storage pattern 2120, and the blocking insulation pattern 2150. Additionally, the ground and string selection lines GSL and SSL may share the tunnel insulation layer 2110, the charge storage pattern 2120, and the blocking insulation pattern 2150. A cell spacer (not shown) may be disposed on the sidewalls of the control gate electrode 2160. The cell spacer may be disposed on the extended blocking insulation pattern 2150.

The blocking insulation pattern 2150 may include a first blocking insulation pattern 2150a, a second blocking insulation pattern 2150b, and a third blocking insulation pattern 2150c.

Figure 19A:
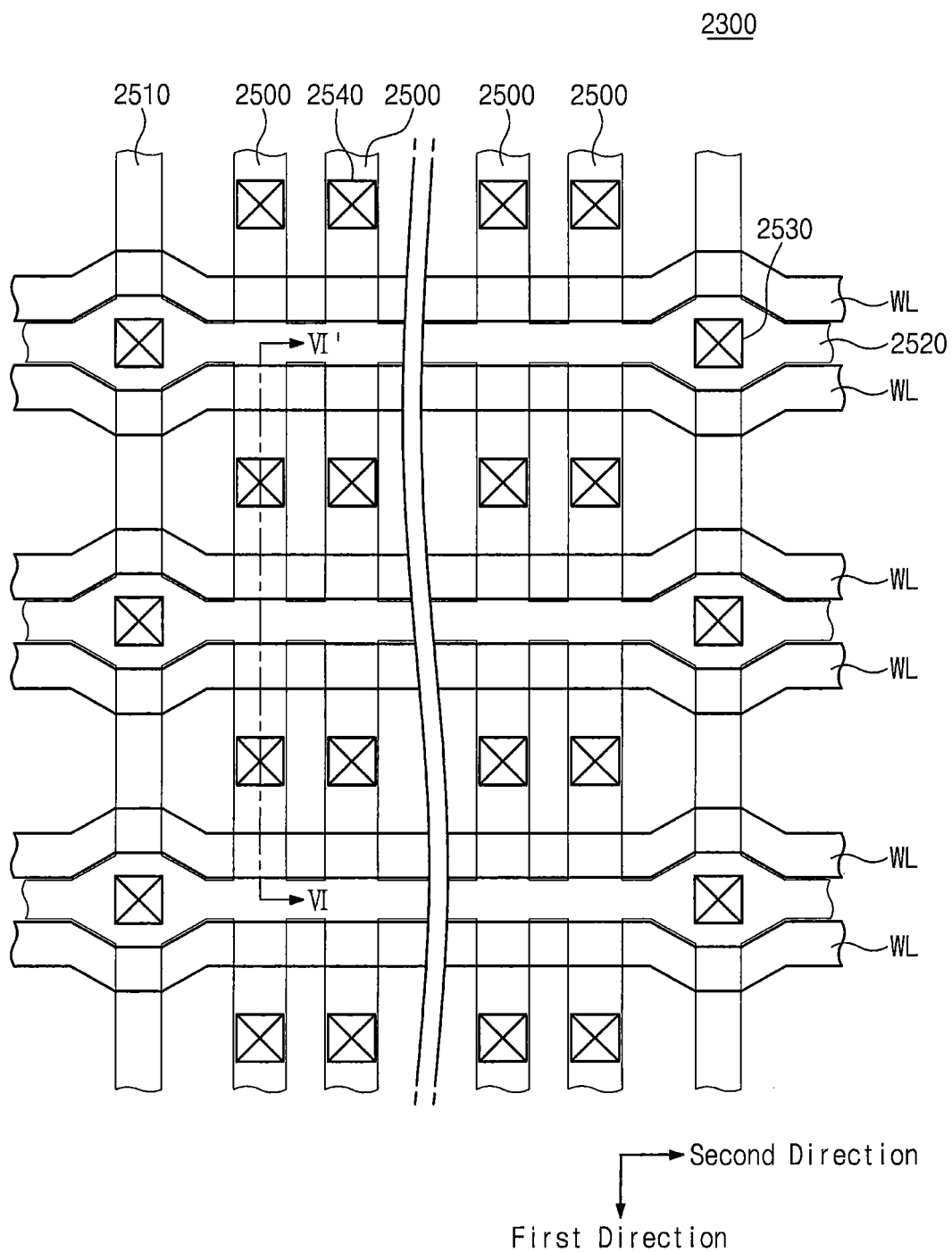
FIGS. 19A and 19B are respective plan and cross sectional views illustrating a NOR non-volatile memory device according to embodiments of the present invention.
Figure 19B:
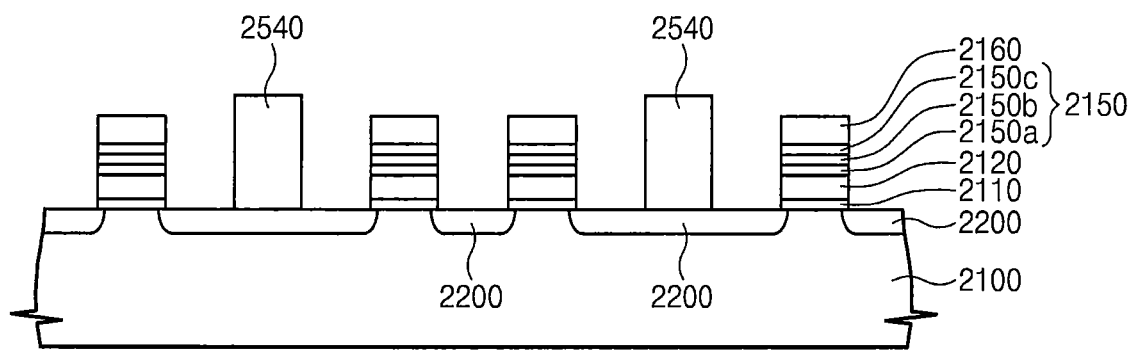

FIGS. 19A and 19B are views illustrating a NOR non-volatile memory device according to embodiments of the present invention. FIG. 19B is a cross-sectional view taken along a line VI-VI' of FIG. 19A.

Referring to FIGS. 19A and 19B, the NOR non-volatile memory device according to embodiments of the present invention includes a semiconductor substrate 2100 having a cell region. A device isolation layer 2300 is disposed on the semiconductor substrate 2100. The device isolation layer 2300 defines active regions 2500, 2510, and 2520. The first active regions 2500 are arranged laterally in a first direction. The source strapping active regions 2510 are regularly arranged in a first direction at the both sides of the first active regions 2500. The second active regions 2520 that laterally cross over the first active regions 2500 are disposed in a second direction. The second active regions 2520 serve as a source line.

A pair of word lines WL is disposed in the second direction and crosses over the first active regions 2500 and the source strapping active regions 2510. Active regions disposed on the both sides of the pair of word lines become drains of a transistor, and an active region between the pair of word lines becomes a source of a transistor. The drain of the transistor is electrically connected to a bit line through a bit line contact plug 2540.

Moreover, the sources of a transistor are electrically connected to adjacent sources in the second direction through the second active region 2520. Accordingly, the second active region 2520 serves as a source line. A source contact 2530 is formed at a position where the second active region 2520 and the source strapping active region 2510 intersect.

The word line WL includes a tunnel insulation pattern 2110, a charge storage pattern 2120, a blocking insulation pattern 2150, and a control gate electrode 2160, which are sequentially-stacked on the semiconductor substrate 2100.

The tunnel insulation pattern 2110, the charge storage pattern 2120, and the blocking insulation pattern 2150 may extend in the second direction, and the word line WL may share the tunnel insulation pattern 2110, the charge storage pattern 2120, and the blocking insulation pattern 2150. A spacer (not shown) may be disposed on the extended blocking insulation pattern 2150.

The blocking insulation pattern 2150 includes a first blocking insulation layer 2150a, a second blocking insulation layer 2150b, and a third blocking insulation layer 2150c.

Figure 20:
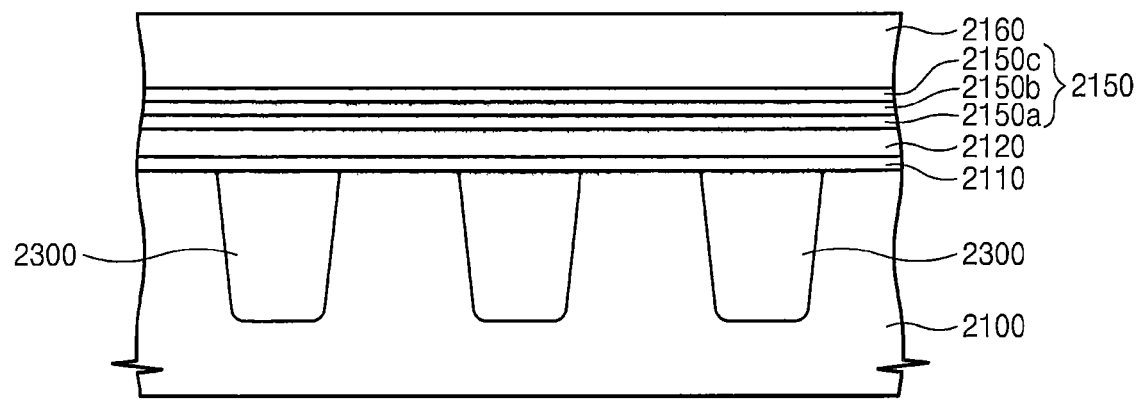
FIG. 20 is a cross-sectional view taken along a line V-V' of FIG. 18A illustrating a charge trap non-volatile memory device according to some embodiments of the present invention.

FIG. 20 is a cross-sectional view taken along a line V-V' of FIG. 18A illustrating a charge trap non-volatile memory device according to some embodiments of the present invention. FIGS. 21A through 21D illustrate flat band energy band diagrams of a non-volatile memory device according to embodiments of the present invention.

Referring to FIGS. 20 and 21A through 21D, the non-volatile memory device includes a tunnel insulation pattern 2110 formed on a semiconductor substrate 2100, a charge storage pattern 2120 formed on the tunnel insulation pattern 2110, a blocking insulation pattern 2150 formed on the charge storage pattern 2120, and a control gate electrode 2160 formed on the blocking insulation pattern 2150. Additionally, a device isolation layer 2300 is formed in the semiconductor substrate 2100 to define active regions ACT. The charge storage pattern 2120 may not be separated by a unit cell. The blocking insulation pattern 2150 includes a first blocking insulation pattern 2150a, a second blocking insulation pattern 2150b, and a third blocking insulation pattern 2150c, which are sequentially-stacked. The first blocking insulation pattern 2150a and the third blocking insulation pattern may be formed of the same material. An energy band gap $E_{g2}$ of the second blocking insulation pattern 2150b may be greater than energy band gaps $E_{g1}$ of $E_{g3}$ of the first and third blocking insulation patterns 2150a and 2150c. The device isolation layer 2300 is disposed on the semiconductor substrate 2100 to define active regions ACT. This non-volatile memory device may have a structure in which the charge storage pattern 2120 is not divided by unit cells.

The semiconductor substrate 2100 may include one selected from a single crystalline silicon layer, a silicon on insulator (SOI), a silicon layer on a silicon germanium layer, a silicon single crystalline layer on an insulation layer, and/or a polysilicon layer on an insulation layer.

The tunnel insulation pattern 2110 may include at least one of a silicon oxide layer, a silicon oxide nitride layer, and/or a high-k dielectric material. The high-k dielectric material includes at least one of an aluminum oxide layer, a hafnium oxide layer, a hafnium aluminum oxide layer, a hafnium silicon oxide layer, a zirconium oxide layer, and a tantalum oxide layer. The silicon oxide layer may be a thermal oxide layer.

The charge storage pattern 2120 may be formed of a material having traps to store electric charges. The charge storage pattern 2120 may include a dielectric layer. The charge storage pattern 2120 may include at least one of a silicon nitride layer, a metal quantum dot, a silicon quantum dot, metal, doped silicon, and doped germanium. A metal for the charge storage pattern 2120 may include at least one of a pure metal and/or a metal compound. The charge storage pattern 2120 may include a multilayer of at least one selected from nano crystalline silicon, nano crystalline metal, a germanium quantum dot, a metal quantum dot, and/or a silicon quantum dot.

The charge storage pattern 2120 may have a metal trap site provided by metal doping. Additionally, a deep trap site may be formed in an energy band of the charge storage pattern 2120 using a wet oxidation operation after the charge storage pattern 2120 is formed.

The blocking insulation pattern 2150 may include a first blocking insulation pattern 2150a, a second blocking insulation pattern 2150b, and a third blocking insulation pattern 2150c. The first blocking insulation pattern 2150a is disposed on the charge storage pattern 2120, the second blocking insulation pattern 2150b is disposed on the first blocking insulation pattern 2150a, and the third blocking insulation layer pattern 2150c is disposed on the second blocking insulation pattern 2150b. Moreover, an energy band gap $E_{g2}$ of the second blocking insulation pattern 2150b may be greater than energy band gaps $E_{g1}$ of $E_{g3}$ of the first blocking insulation pattern 2150a and the third blocking insulation pattern 2150c. The blocking insulation pattern 2150 may have a permittivity and a charge trap. The charge trap density of the blocking insulation pattern 2150 may increase in proportion to the permittivity.

According to some embodiments of the present invention, a permittivity of the second blocking insulation pattern 2150b may be less than permittivities of the first and third blocking insulation pattern 2150a and 2150c, and a charge trap density of the second blocking insulation pattern 2150b may be less than charge trap densities of the first and third blocking insulation pattern 2150a and 2150c. The charge trap densities of the first blocking insulation pattern 2150a, the second blocking insulation pattern 2150b, and the third blocking insulation pattern 2150c may be in proportion to their permittivities.

The first and third blocking insulation patterns 2150a and 2150c may each include at least one of a metal oxide layer, a metal nitride layer, and/or a metal oxide nitride layer. A metal oxide layer may include at least one of a hafnium silicon oxide layer, a zirconium oxide layer, a hafnium aluminum oxide layer, a hafnium oxide layer, and/or an aluminum oxide layer.

The second blocking insulation pattern 2150b may include at least one of a silicon oxide layer, a metal oxide layer, a metal nitride layer, and/or a metal oxide nitride layer. The metal oxide layer may include at least one of a hafnium silicon oxide layer, a zirconium oxide layer, a hafnium aluminum oxide layer, a hafnium oxide layer, and/or an aluminum oxide layer. The blocking insulation pattern 2150 may be formed using an atomic layer deposition (ALD), chemical vapor deposition (CVD), and/or physical vapor deposition (PVD) process.

After the first blocking insulation pattern 2150a, the second blocking insulation pattern 2150b, and the third blocking insulation pattern 2150c are formed, an anneal process including at least one of $O_2$, $N_2$, and $NH_3$ and/or a plasma process may be performed. By providing and anneal and/or a plasma process, charge trap densities of the first blocking insulation pattern 2150a, the second blocking insulation pattern 2150b, and the third blocking insulation pattern 2150c may be reduced.

The control gate electrode 2160 may be a conductive material having a work function that is greater than 4.5 eV. For example, the control gate electrode 2160 may include at least one of TaN, polysilicon, W, WN, TiN, and/or $CoSi_x$. The control gate electrode 2160 may include another conductive material. For example, the control gate electrode 2160 may include a structure of a multilayered barrier metal and a high work function metal. The high work function metal may have a work function of greater than 4.5 eV. The barrier metal may include at least one of a metal nitride layer, a silicon nitride layer, and/or a combination thereof, each of which may reduce reaction between the high work function metal and the blocking insulation layer. The control gate electrode 2160 may further include at least one of a high work function metal and doped polysilicon interposed between the barrier metal and the blocking insulation pattern 2150. The control gate electrode 2160 may include at least one of sequentially-stacked doped silicon and metal, a pure metal, and/or a metal containing material.

Figure 21A:
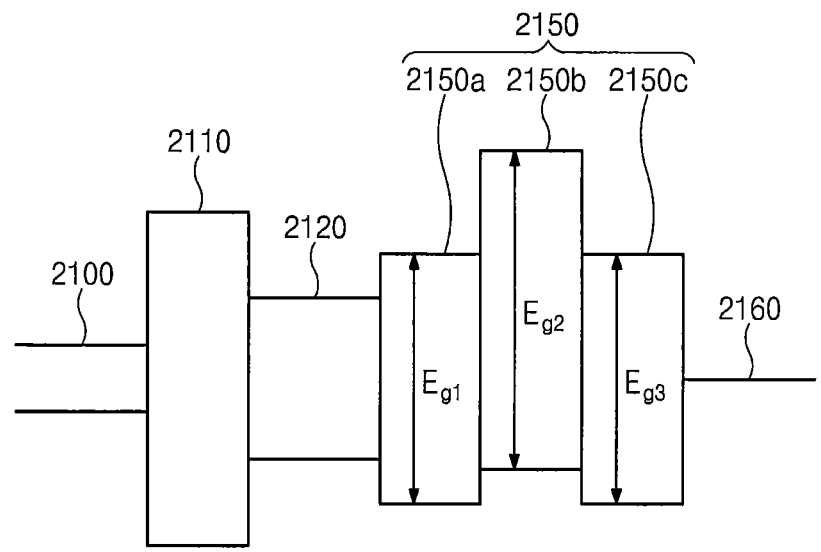
FIGS. 21A through 21D illustrate flat band energy band diagrams of a non-volatile memory device according to some embodiments of the present invention.

Referring to FIG. 21A, an energy band gap $E_{g2}$ of the second blocking insulation pattern 2150b is greater than energy band gaps $E_{g1}$ of $E_{g3}$ of the first and third blocking insulation patterns 2150a and 2150c. A conduction band of the second blocking insulation pattern 2150b is higher than conduction bands of the first and third blocking insulation patterns 2150a and 2150c. A valence band of the second blocking insulation pattern 2150b is higher than valence bands of the first and third blocking insulation patterns 2150a and 2150c.

Figure 21B:
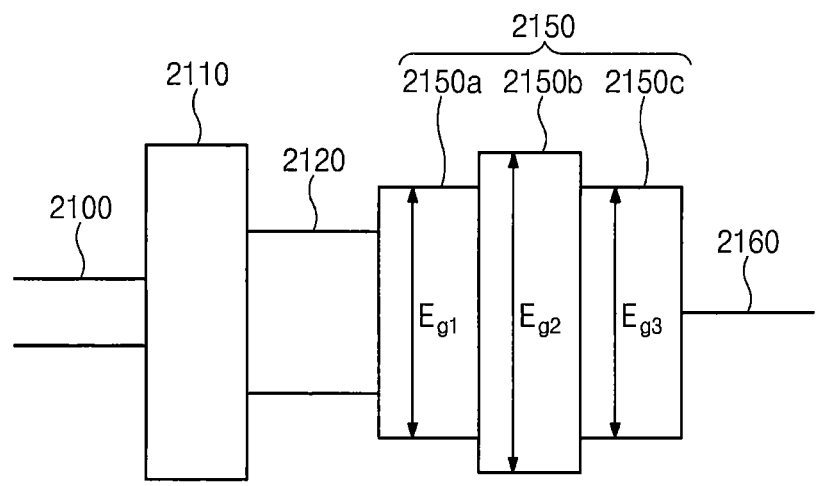

Referring to FIG. 21B, an energy band gap $E_{g2}$ of the second blocking insulation pattern 2150b is greater than energy band gaps $E_{g1}$ of $E_{g3}$ of the first and third blocking insulation patterns 2150a and 2150c. A conduction band of the second blocking insulation pattern 2150b is higher than conduction bands of the first and third blocking insulation patterns 2150a and 2150c. A valence band of the second blocking insulation pattern 2150b is lower than valence bands of the first and third blocking insulation patterns 2150a and 2150c.

Figure 21C:
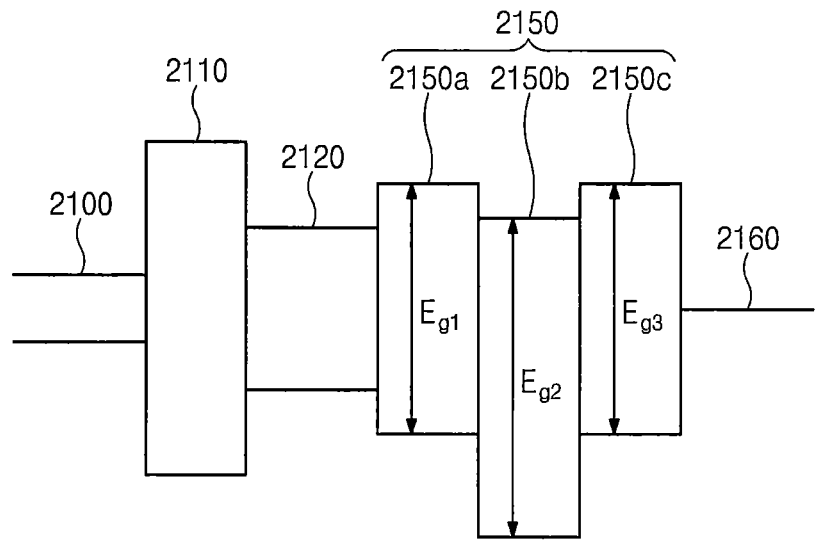

Referring to FIG. 21C, an energy band gap $E_{g2}$ of the second blocking insulation pattern 2150b is greater than energy band gaps $E_{g1}$ of $E_{g3}$ of the first and third blocking insulation patterns 2150a and 2150c. A conduction band of the second blocking insulation pattern 2150b is lower than conduction bands of the first and third blocking insulation patterns 2150a and 2150c. A valence band of the second blocking insulation pattern 2150b is lower than valence bands of the first and third blocking insulation patterns 2150a and 2150c.

Figure 21D:
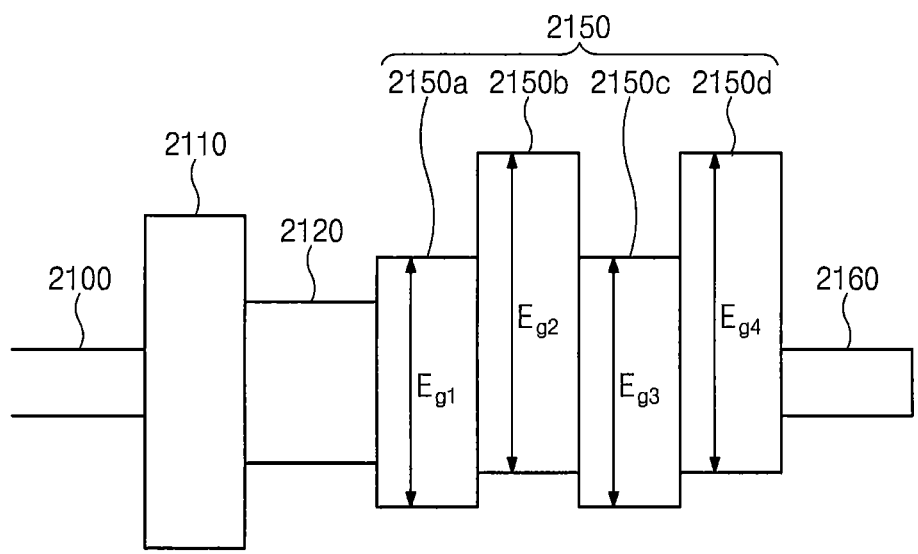

Referring to FIG. 21D, the blocking insulation pattern 2150 may further include a fourth blocking insulation pattern 2150d to allow two materials having respectively different energy band gaps to be alternately disposed. The fourth blocking insulation pattern 2150d is formed of the same material as the second blocking insulation pattern 2150b. Accordingly, an energy band gap $E_{g4}$ of the fourth blocking insulation pattern is the same as that of the second blocking insulation 2150b. Additionally, according to modified embodiments of the present invention, the blocking insulation pattern 2150 may further include the fourth blocking insulation pattern 2150d and a fifth blocking insulation pattern (not shown). The fourth blocking insulation pattern 2150d is formed of the same material as the second blocking insulation pattern 2150d, and the fifth blocking insulation layer may be formed of the same material as the first blocking insulation pattern 2150a.

Figure 22:
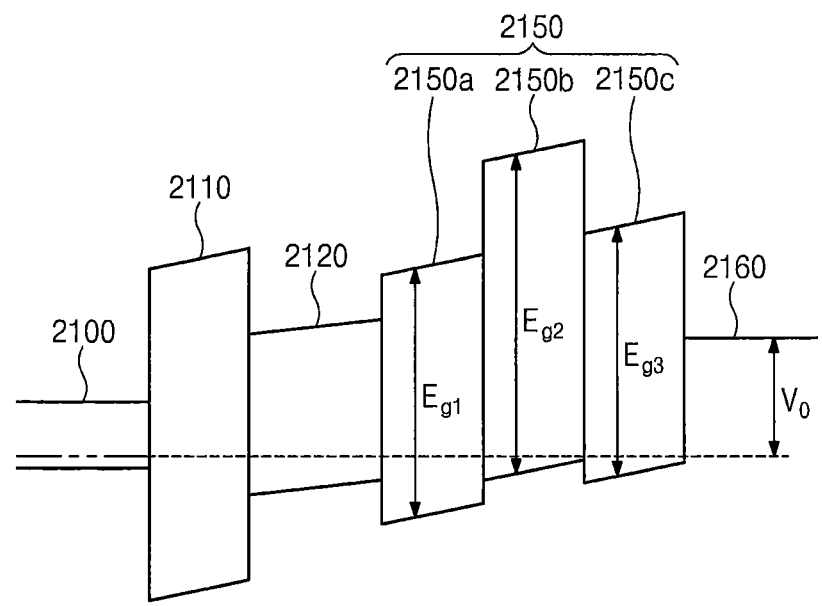
FIG. 22 illustrates an energy band diagram when a negative erase voltage $V_O$ is applied to a non-volatile memory device according to embodiments of the present invention.

FIG. 22 illustrates an energy band diagram when a negative erase voltage $V_O$ is applied to a non-volatile memory device according to embodiments of the present invention. FIG. 22 illustrates a state where electric charges stored in the charge storage pattern 2120 are substantially and/or completely removed by the negative erase voltage $V_O$ applied from an external source.

In more detail, when the negative erase voltage $V_O$ is applied between the control gate electrode 2160 of the semiconductor substrate 2100, an electric field is generated in the tunnel insulation pattern 2110, the charge storage pattern 2120, and the blocking insulation pattern 2150. Each electric field may be calculated using a voltage distribution model. A back tunneling current flowing through the blocking insulation pattern 2150 may depend on an electric field of the blocking insulation pattern 2150. The back tunneling current can be controlled by adjusting a structure, a band gap, a thickness, and/or a permittivity of the blocking insulation pattern 2150. Each electric filed may be calculated as follows.

$$V_i = \frac{V_0 t_i}{t_i + \varepsilon_i \sum_{j=1, i \ne j}^{n=5} \left(\frac{t_i}{\varepsilon_i}\right)}$$

where the suffixes i and j may be 1 through 5. The suffixes 1 through 5 represent the tunnel insulation pattern 2110, the charge storage pattern 2120, the first blocking insulation pattern 2150a, the second blocking insulation pattern 2150b, and the third blocking insulation pattern 2150d, respectively. The variable t represents a thickness and the variable ∈ represents a permittivity.

For example, by increasing the thicknesses of the first blocking insulation pattern 2150a and the third blocking insulation pattern 2150c having relatively high permittivities, electric fields of the first blocking insulation pattern 2150a and the third blocking insulation pattern 2150c can be reduced. The first blocking insulation pattern 2150a and the third blocking insulation pattern 2150c, however, may have a high charge trap density due to a high permittivity. Moreover, electric charges captured in the charge trap may easily transfer to an external electric field. Accordingly, there may be limits to increasing thicknesses of the first and second blocking insulation patterns 2150a and 2150c of high permittivities.

On the other hand, by increasing a work function difference between the third blocking insulation pattern 2150c and the control gate electrode 2160, a threshold energy for generating a back tunneling phenomenon may be increased to reduce a back tunneling current. If an energy band gap of the second blocking insulation pattern 2150b is less than energy band gaps of the third blocking insulation pattern 2150c and the first blocking insulation pattern 2150c, electrons or electron holes may be stored in an energy well of the second blocking insulation pattern 2150b. Accordingly, an energy band of the second blocking insulation pattern 2150b may be greater than energy bands of the first and third blocking insulation patterns 2150a and 2150c.

According to some embodiments of the present invention, the permittivities and charge trap densities of each of the first blocking insulation pattern 2150a and the third blocking insulation pattern 2150c may be greater than a permittivity and a charge trap density of the second blocking insulation pattern 2150b. Electric charges trapped in the first blocking insulation pattern 2150a may not easily pass through the second blocking insulation pattern 2150b due to an external electric field so that reliability may be improved.

Figure 23:
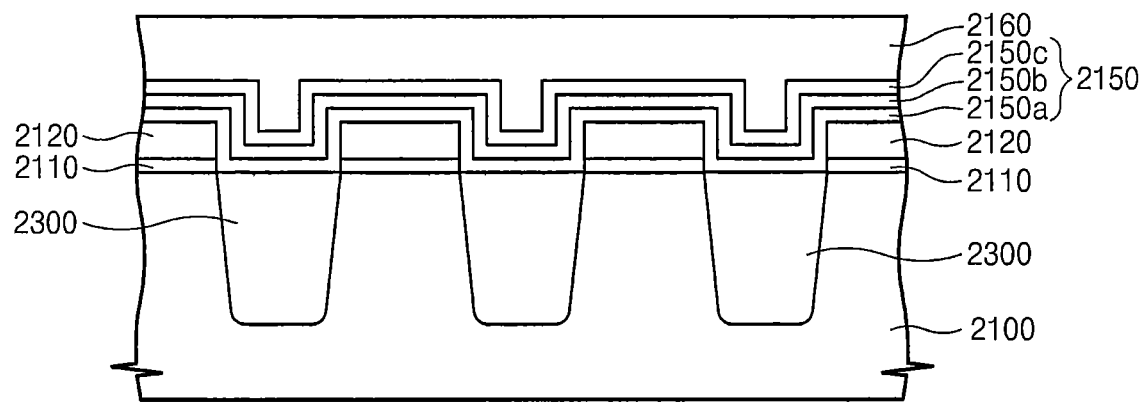
FIG. 23 is a cross-sectional view taken along a line V-V' of FIG. 18A illustrating a floating gate non-volatile memory device according to other embodiments of the present invention.

FIG. 23 is a cross-sectional view taken along a line V-V' of FIG. 18A to illustrate a floating gate non-volatile memory device according to other embodiments of the present invention. Further description of elements previously discussed with respect to FIGS. 20 and 21 will be omitted for conciseness.

Referring to FIG. 23, the floating gate non-volatile memory device includes a tunnel insulation pattern 2110 formed on a semiconductor substrate 2100, a charge storage pattern 2120 formed on the tunnel insulation pattern 2110, a blocking insulation pattern 2150 formed on the charge storage pattern 2120, and a control gate electrode 160 formed on the blocking insulation pattern 2150. Moreover, a device isolation layer 2300 is formed in the semiconductor substrate 2100 to define the active regions ACT. The charge storage pattern 2120 may have a structure in which the charge storage patterns 2120 of each unit cell are separated.

The charge storage pattern 2120 may be a floating gate, and the charge storage pattern 2120 may include a conductive material. The floating gate may include at least one of n-type conductive polysilicon, p-type conductive polysilicon, metal, doped silicon, and/or doped germanium.

The control gate electrode 2160 may include at least one of polysilicon doped with a conductive material, metal, metal silicide, a metal compound, and/or a multilayer structure thereof.

Figure 24A:
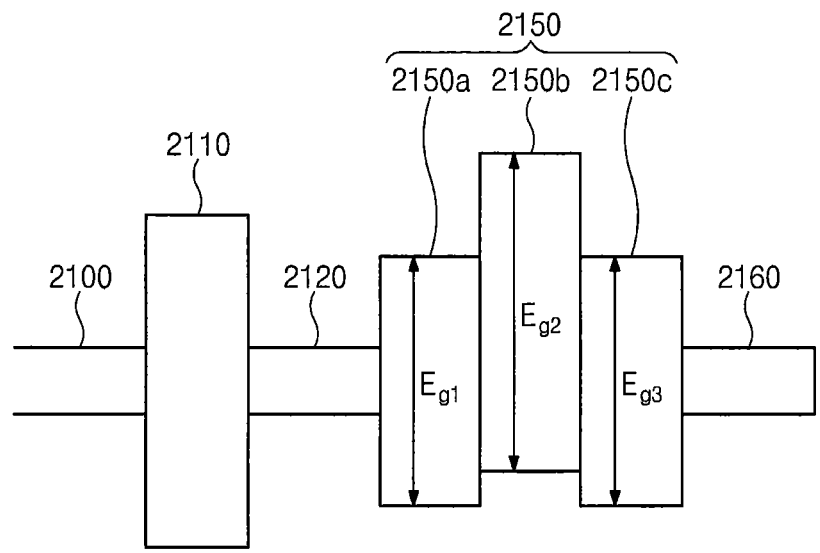
FIGS. 24A through 24C illustrate flat band energy band diagrams of a non-volatile memory device according to other embodiments of the present invention.
Figure 24B:
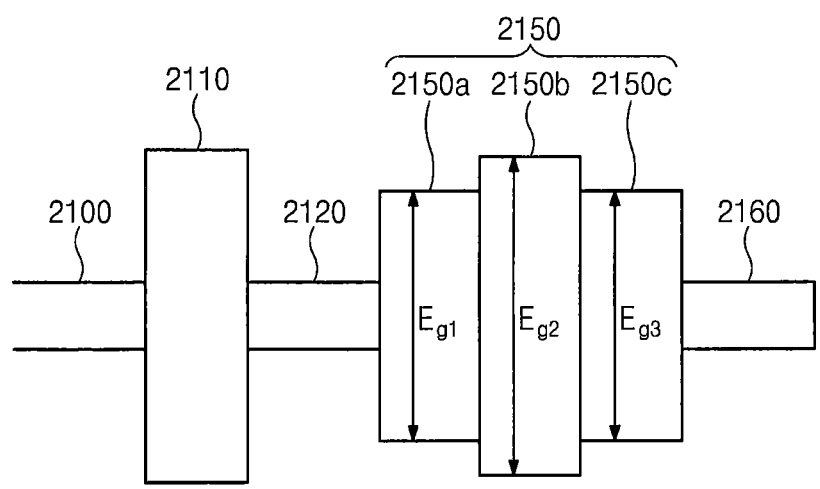
Figure 24C:
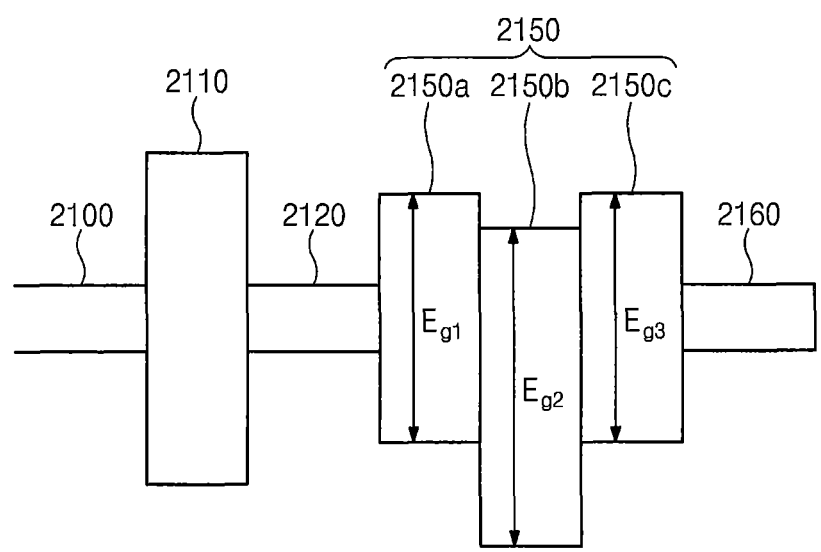

FIGS. 24A through 24C illustrate flat band energy band diagrams of a non-volatile memory device according to other embodiments of the present invention. However, FIGS. 24A though 24C illustrate energy band diagrams when doped polysilicon is used as the charge storage pattern 2120 and doped polysilicon is used as the control gate electrode 2160.

Referring to FIG. 24A, an energy band gap $E_{g2}$ of the second blocking insulation pattern 2150b is greater than energy band gaps $E_{g1}$ of $E_{g3}$ of the first and third blocking insulation patterns 2150a and 2150c. A conduction band of the second blocking insulation pattern 2150b is higher than conduction bands of the first and third blocking insulation patterns 2150a and 2150c. A valence band of the second blocking insulation pattern 2150b is higher than valence bands of the first and third blocking insulation patterns 2150a and 2150c.

Referring to FIG. 24B, an energy band gap $E_{g2}$ of the second blocking insulation pattern 2150b is greater than energy band gaps $E_{g1}$ of $E_{g3}$ of the first and third blocking insulation patterns 2150a and 2150c. A conduction band of the second blocking insulation pattern 2150b is higher than conduction bands of the first and third blocking insulation patterns 2150a and 2150c. A valence band of the second blocking insulation pattern 2150b is lower than valence bands of the first and third blocking insulation patterns 2150a and 2150c.

Referring to FIG. 24C, an energy band gap $E_{g2}$ of the second blocking insulation pattern 2150b is greater than energy band gaps $E_{g1}$ of $E_{g3}$ of the first and third blocking insulation patterns 2150a and 2150c. A conduction band of the second blocking insulation pattern 2150b is lower than conduction bands of the first and third blocking insulation patterns 2150a and 2150c. A valence band of the second blocking insulation pattern 2150b is lower than valence bands of the first and third blocking insulation patterns 2150a and 2150c.

Referring to FIG. 24A again, according to modified embodiments of the present invention, the blocking insulation 2150 may further include a fourth blocking insulation pattern (not shown) to allow two materials having respectively different energy band gaps to be alternately disposed. The fourth blocking insulation pattern may be formed of the same material as the second blocking insulation pattern 2150b. Accordingly, an energy band gap of the fourth blocking insulation pattern is the same as that of the second blocking insulation. Additionally, according to modified embodiments of the present invention, the blocking insulation pattern 2150 may further include the fourth blocking insulation pattern and a fifth blocking insulation patter (not shown). The fourth blocking insulation pattern is formed of the same material as the second blocking insulation pattern 2150d, and the fifth blocking insulation layer may be formed of the same material as the first blocking insulation pattern 2150a.

According to additional embodiments of the present invention, non-volatile memory devices disclosed in the above-mentioned embodiments may be included in an electronic system.

According to some embodiments of the present invention, by forming an interface layer pattern between a charge storage pattern and a blocking insulation pattern, a leakage current between the charge storage pattern and the blocking insulation pattern may be reduced and reliability of a non-volatile memory device may be improved.

According to some embodiments of the present invention, by inserting a large region that includes a plurality of blocking insulation patterns and has a large energy band gap, a retention time of a non-volatile memory device may be extended and also its operating speed may be improved by reducing a back tunneling current.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A non-volatile memory device comprising:
a semiconductor layer;
a tunnel insulation layer on the semiconductor layer;
a charge storage pattern on the tunnel insulation layer;
a blocking insulation pattern on the charge storage pattern, the blocking insulation pattern comprising,
a first blocking insulation sub-layer comprising Hf,
a second blocking insulation sub-layer comprising $SiO_2$, and
a third blocking insulation sub-layer comprising Hf; and
a control gate electrode on the blocking insulation pattern.

2. The non-volatile memory device of claim 1, further comprising:
a first interface layer pattern between the charge storage pattern and the blocking insulation pattern.

3. The non-volatile memory device of claim 1, wherein the charge storage pattern comprises at least one of a charge trapping insulating layer or a conductive floating gate.

4. The non-volatile memory device of claim 1, wherein the charge storage pattern comprises at least one of silicon nitride, metal quantum dot, silicon quantum dot, metal, doped silicon, or doped germanium.

5. The non-volatile memory device of claim 1, wherein the charge storage pattern comprises at least one of n-type conductive polysilicon, p-type conductive polysilicon, metal, or doped germanium.

6. The non-volatile memory device of claim 1, wherein a permittivity of the second blocking insulation sub-layer is less than permittivities of the first and third blocking insulation sub-layers.

7. The non-volatile memory device of claim 1, wherein the second blocking insulation sub-layer is between the first and third blocking insulation sub-layers.

8. The non-volatile memory device of claim 1, wherein the semiconductor layer includes a channel region.

9. A non-volatile memory device comprising:
a semiconductor layer;
a tunnel insulation layer on the semiconductor layer;
a charge storage pattern on the tunnel insulation layer;
a blocking insulation pattern on the charge storage pattern, the blocking insulation pattern comprising,
a first blocking insulation sub-layer formed of a high-k material,
a second blocking insulation sub-layer formed of a non-high-k material, and
a third blocking insulation sub-layer formed of the high-k material,
wherein the second blocking insulation sub-layer is between the first and third blocking insulation sub-layers; and
a control gate electrode on the blocking insulation pattern.

10. The non-volatile memory device of claim 9, wherein the high-k material comprises at least one of aluminum oxide, hafnium oxide, zirconium oxide, and hafnium aluminum oxide.

11. The non-volatile memory device of claim 10, wherein the non-high-k material comprises $SiO_2$.

12. The non-volatile memory device of claim 9, further comprising:
a first interface layer pattern between the charge storage pattern and the blocking insulation pattern.

13. The non-volatile memory device of claim 9, wherein the charge storage pattern comprises at least one of a charge trapping insulating layer or a conductive floating gate.

14. The non-volatile memory device of claim 9, wherein the charge storage pattern comprises at least one of silicon nitride, metal quantum dot, silicon quantum dot, metal, doped silicon, or doped germanium.

15. The non-volatile memory device of claim 9, wherein the charge storage pattern comprises at least one of n-type conductive polysilicon, p-type conductive polysilicon, metal, or doped germanium.

16. The non-volatile memory device of claim 9, wherein a permittivity of the second blocking insulation sub-layer is less than permittivities of the first and third blocking insulation sub-layers.

17. A non-volatile memory device comprising:
a semiconductor layer;
a tunnel insulation layer on the semiconductor layer;
a charge storage pattern on the tunnel insulation layer;
a blocking insulation pattern on the charge storage pattern, the blocking insulation pattern comprising,
a first blocking insulation sub-layer comprising Hf, and
a second blocking insulation sub-layer comprising $SiO_2$; and
a control gate electrode on the blocking insulation pattern, wherein the second blocking insulation sub-layer is between the first blocking insulation sub-layer and the control gate electrode, wherein the blocking insulation pattern farther comprises a third blocking insulation sub-layer comprising at least one of aluminum oxide, hafnium oxide, zirconium oxide, and hafnium aluminum oxide.

18. The non-volatile memory device of claim 17, wherein the second blocking insulation sub-layer is between the first and third blocking insulation sub-layers.

* * * * *